US 9,773,538 B2

(12) United States Patent
Noguchi et al.

(10) Patent No.: US 9,773,538 B2
(45) Date of Patent: Sep. 26, 2017

(54) NONVOLATILE SEMICONDUCTOR MEMORY

(71) Applicant: KABUSHIKI KAISHA TOSHIBA, Minato-ku (JP)

(72) Inventors: Hiroki Noguchi, Yokohama (JP); Shinobu Fujita, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/266,797

(22) Filed: Sep. 15, 2016

(65) Prior Publication Data

US 2017/0076773 A1 Mar. 16, 2017

(30) Foreign Application Priority Data

Sep. 15, 2015 (JP) .................................. 2015-181663

(51) Int. Cl.
*G11C 11/16* (2006.01)

(52) U.S. Cl.
CPC .......... *G11C 11/1673* (2013.01); *G11C 11/16* (2013.01); *G11C 11/1675* (2013.01)

(58) Field of Classification Search
CPC ............................ G11C 11/16; G11C 11/1675
USPC .................................................. 365/158, 173
See application file for complete search history.

(56) References Cited

U.S. PATENT DOCUMENTS

| 6,205,073 | B1 | 3/2001 | Naji | |
|---|---|---|---|---|
| 6,876,575 | B2* | 4/2005 | Hidaka | ................... G11C 11/15 |
| | | | | 365/158 |
| 6,995,999 | B2* | 2/2006 | Morimoto | ........... G11C 11/5685 |
| | | | | 365/148 |
| 7,916,556 | B2 | 3/2011 | Kitagawa et al. | |
| 8,406,035 | B2* | 3/2013 | Katoh | ..................... G11C 11/14 |
| | | | | 365/148 |
| 8,592,942 | B2* | 11/2013 | Kodama | ................ G11C 17/16 |
| | | | | 257/209 |
| 8,593,853 | B2* | 11/2013 | Katoh | .................. G11C 13/004 |
| | | | | 365/100 |
| 8,638,597 | B2 | 1/2014 | Jung et al. | |
| 8,649,205 | B2* | 2/2014 | Peters | ................. G11C 11/1673 |
| | | | | 365/100 |

(Continued)

FOREIGN PATENT DOCUMENTS

| JP | 11-149783 A | 6/1999 |
|---|---|---|
| JP | 2003-529879 A | 10/2003 |

(Continued)

*Primary Examiner* — Michael Tran
(74) *Attorney, Agent, or Firm* — Oblon, McClelland, Maier & Neustadt, L.L.P.

(57) ABSTRACT

According to one embodiment, a nonvolatile semiconductor memory includes a resistance-change element having first and second terminals, a transistor having third and fourth terminals and a control terminal, the third terminal being electrically connected to the second terminal, and a driver electrically connected to the first and fourth terminals, applying one of a first potential and a second potential to the first terminal and the other of the first and second potentials to the fourth terminal in writing, and applying one of the first and second potentials to the first terminal and the other of the first and second potentials to the fourth terminal in reading.

20 Claims, 31 Drawing Sheets

(56) References Cited

U.S. PATENT DOCUMENTS

| | | | |
|---|---|---|---|
| 8,724,380 B1 * | 5/2014 | Zhou | G11C 11/1659 365/148 |
| 8,957,486 B2 * | 2/2015 | Ito | G11C 11/16 257/421 |
| 8,995,180 B2 * | 3/2015 | Romanovskyy | G11C 13/004 365/158 |
| 9,159,410 B1 * | 10/2015 | Kilmer | G11C 13/003 |
| 9,218,868 B2 * | 12/2015 | Noguchi | G11C 11/1675 |
| 9,378,817 B2 * | 6/2016 | Kawai | G11C 13/0069 |
| 2007/0091671 A1 | 4/2007 | Ooishi et al. | |
| 2007/0280021 A1 | 12/2007 | Ueda et al. | |
| 2008/0165592 A1 | 7/2008 | Kitagawa et al. | |
| 2008/0219043 A1 | 9/2008 | Yoon et al. | |
| 2010/0135066 A1 | 6/2010 | Jung et al. | |
| 2012/0020141 A1 | 1/2012 | Kitagawa et al. | |
| 2012/0230094 A1 | 9/2012 | Jung et al. | |
| 2013/0322161 A1 | 12/2013 | Noguchi et al. | |
| 2014/0244931 A1 | 8/2014 | Kim | |
| 2014/0293685 A1 | 10/2014 | Noguchi et al. | |
| 2014/0332752 A1 | 11/2014 | Kouno et al. | |

FOREIGN PATENT DOCUMENTS

| | | |
|---|---|---|
| JP | 2003-529879 A5 | 10/2003 |
| JP | 2007-115320 A | 5/2007 |
| JP | 2007-323706 A | 12/2007 |
| JP | 2008-192274 A | 8/2008 |
| JP | 4371149 B2 | 11/2009 |
| JP | 2010-520576 A | 6/2010 |
| JP | 2012-27972 A | 2/2012 |
| JP | 2013-45483 A | 3/2013 |
| JP | 2013-251035 A | 12/2013 |
| JP | 5444414 B2 | 3/2014 |
| JP | 2014-191835 A | 10/2014 |
| WO | WO 2013/132781 A1 | 9/2013 |

* cited by examiner

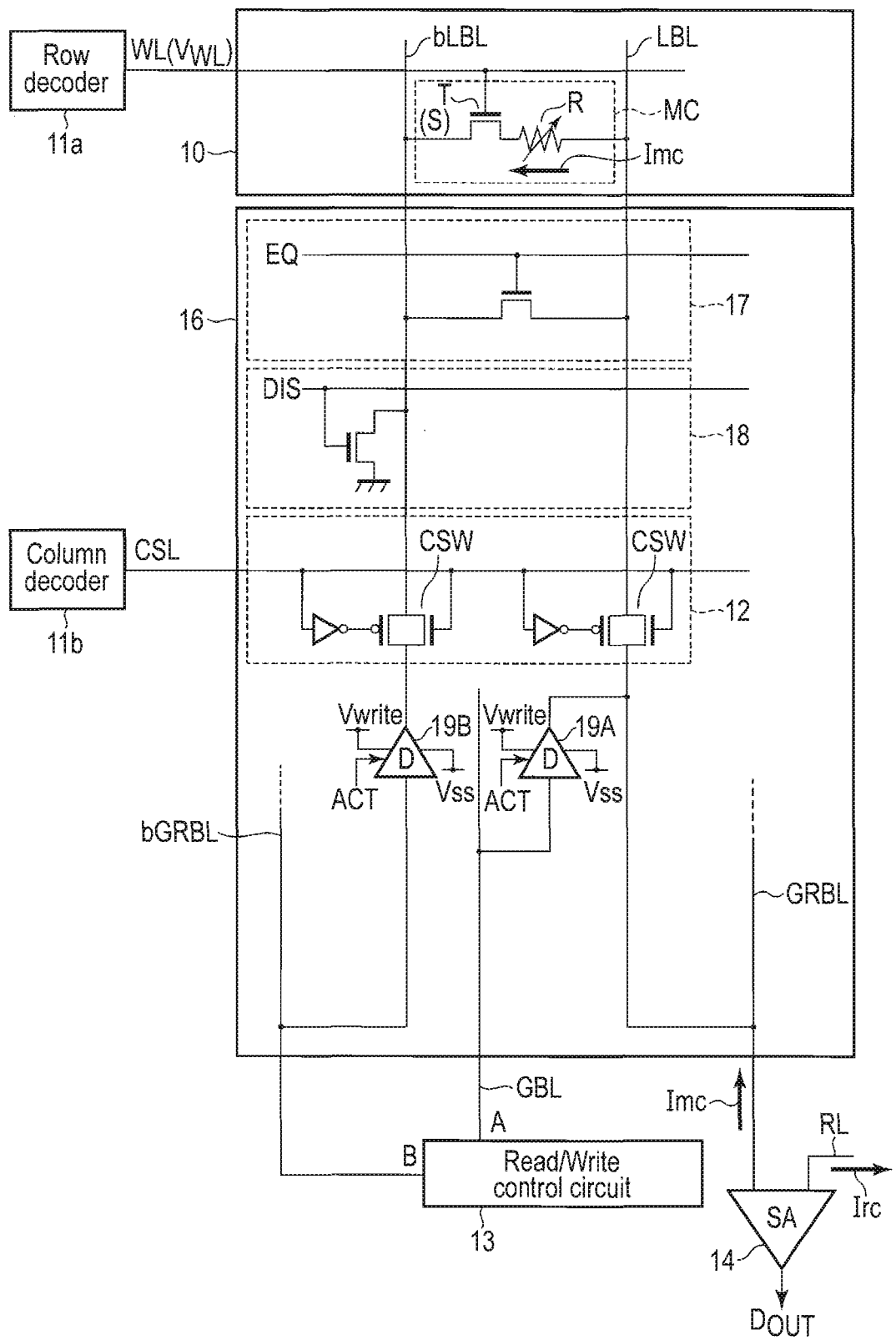
F I G. 3

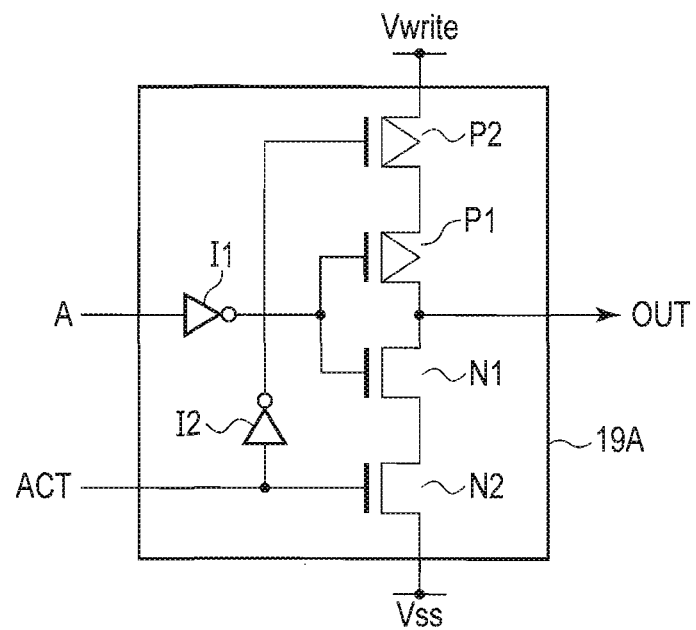
F I G. 5
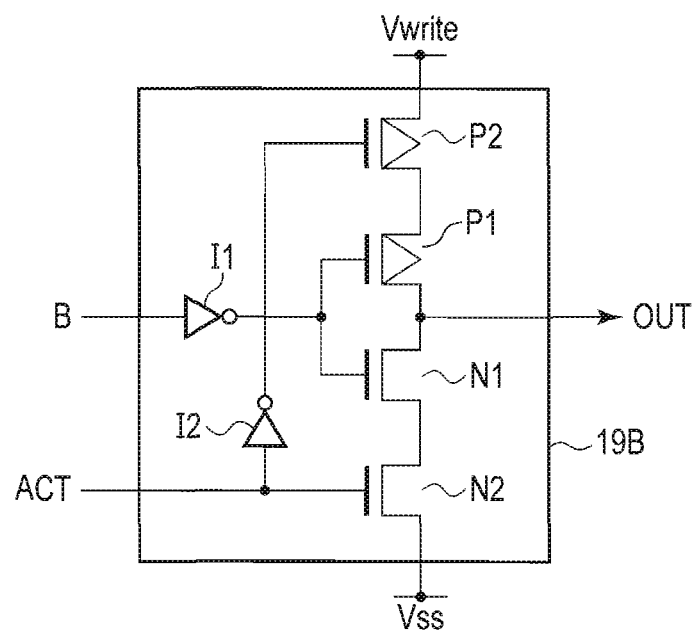
F I G. 6

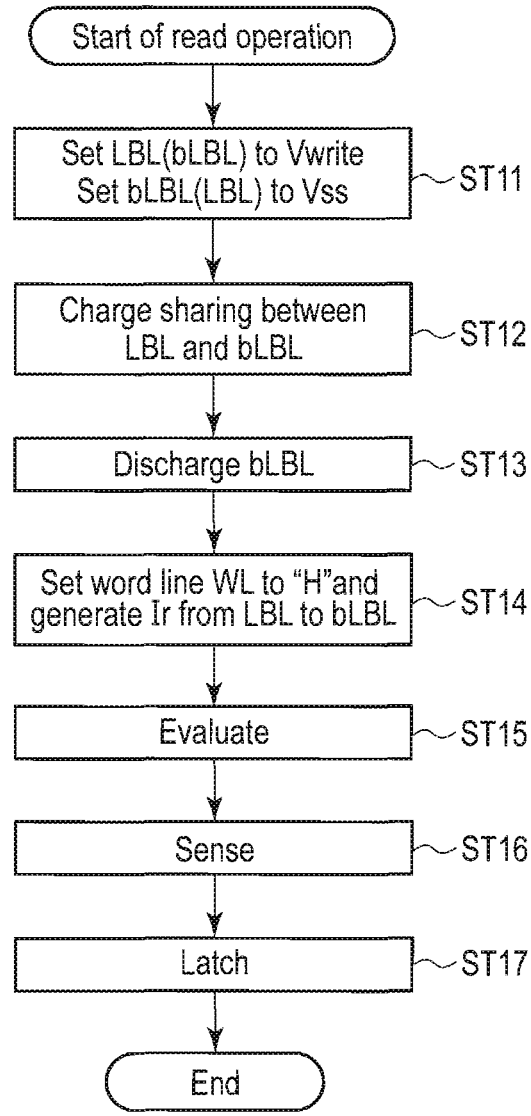
F I G. 7

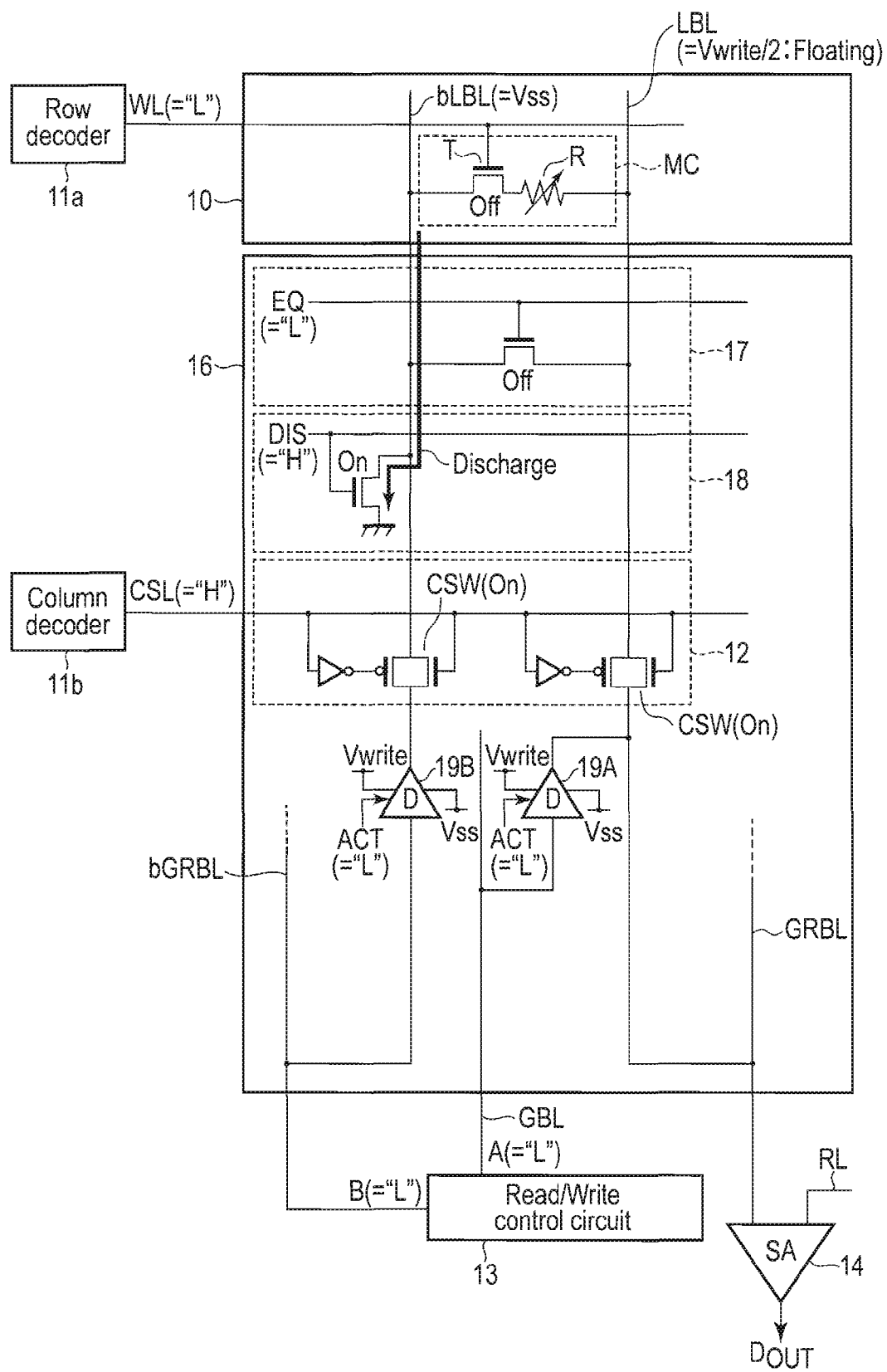
F I G. 11

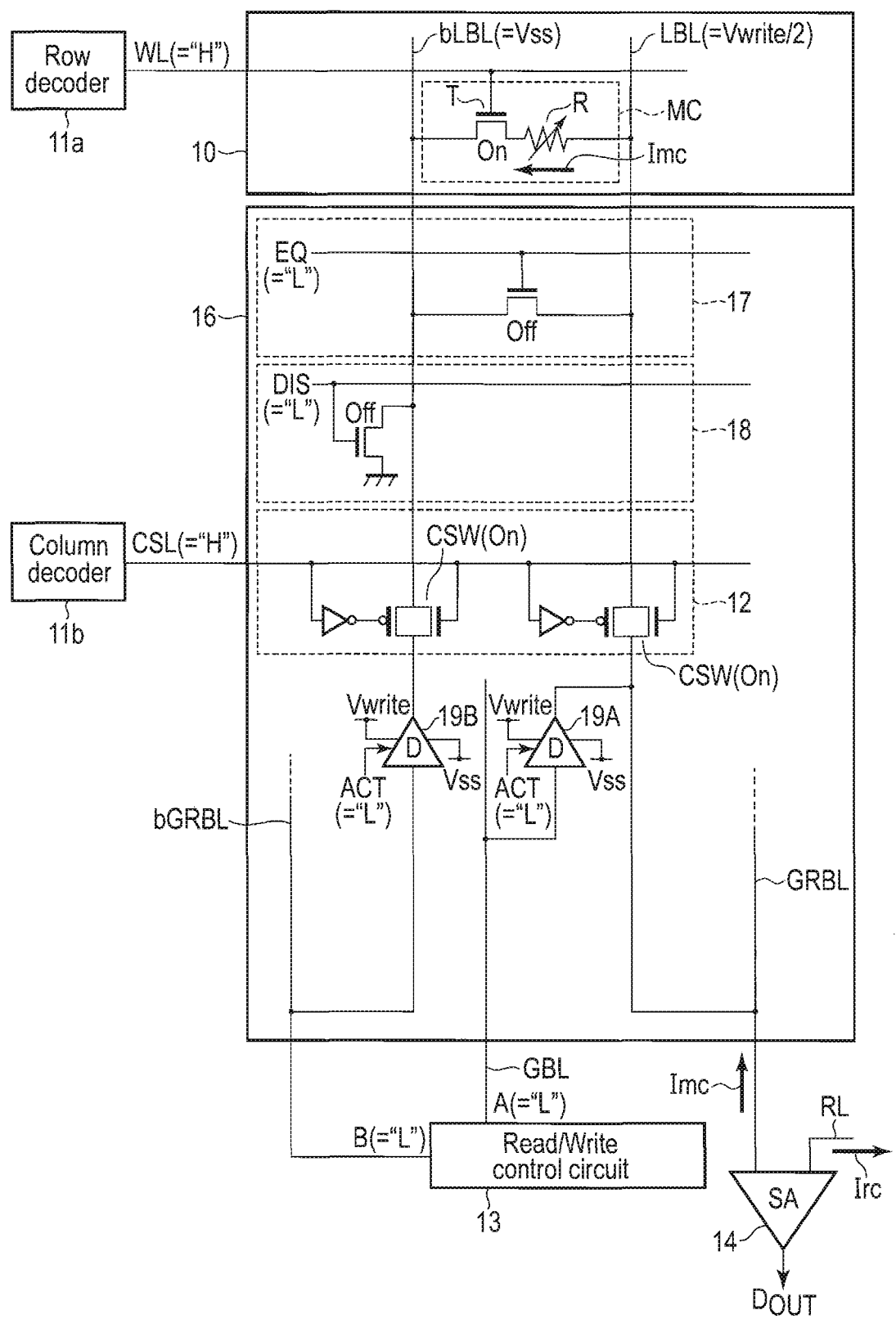
F I G. 12

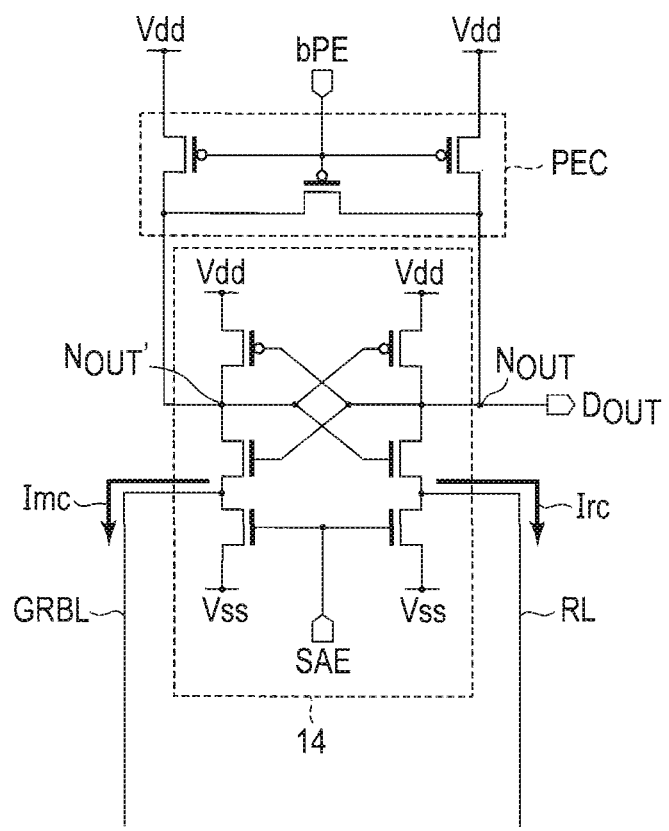
F I G. 14

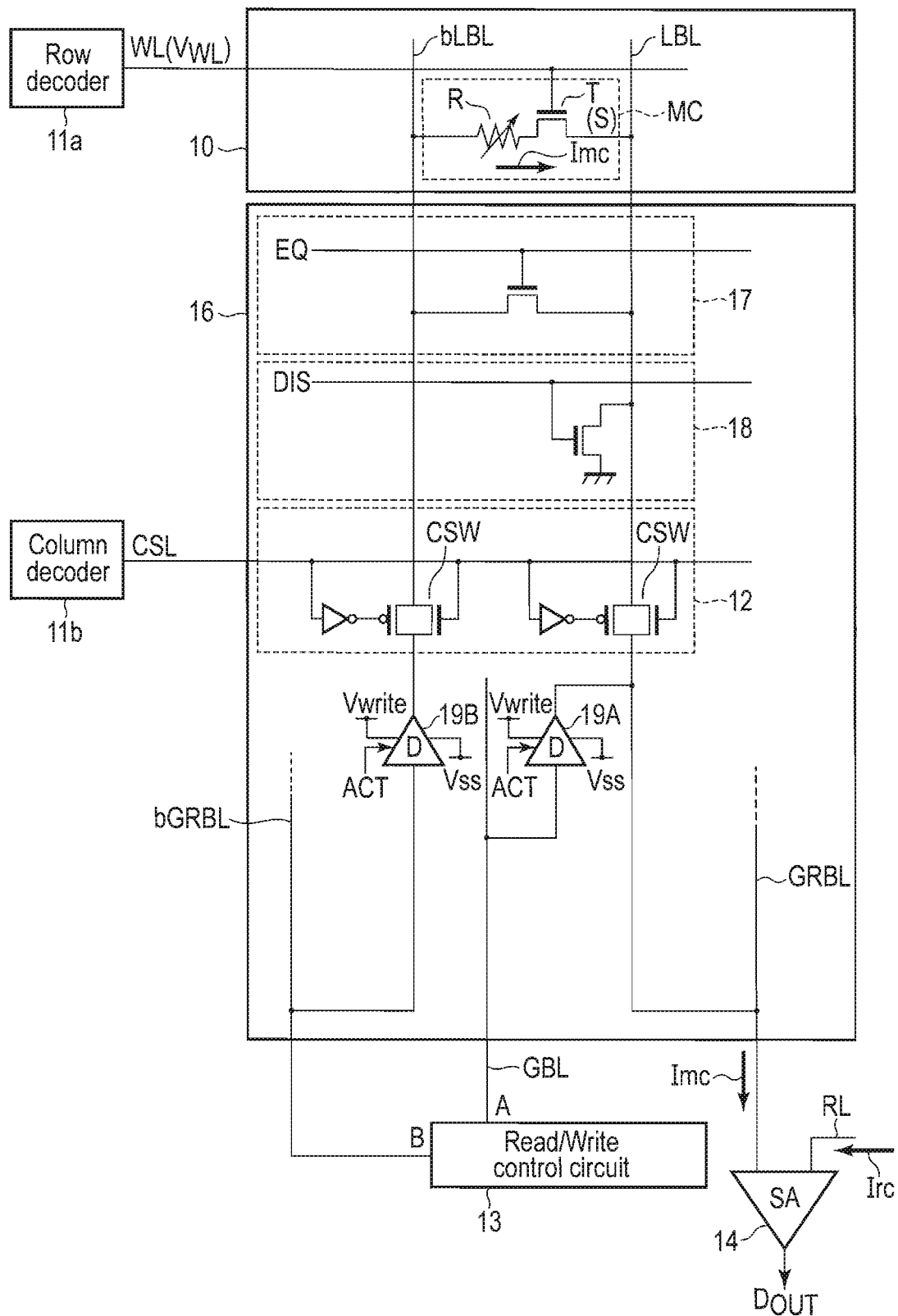
F I G. 15

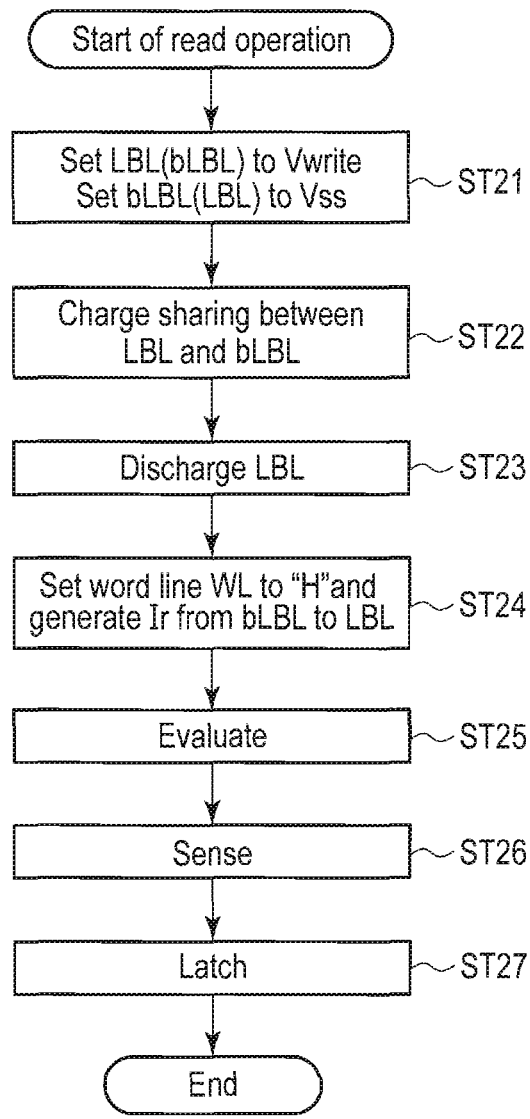
F I G. 16

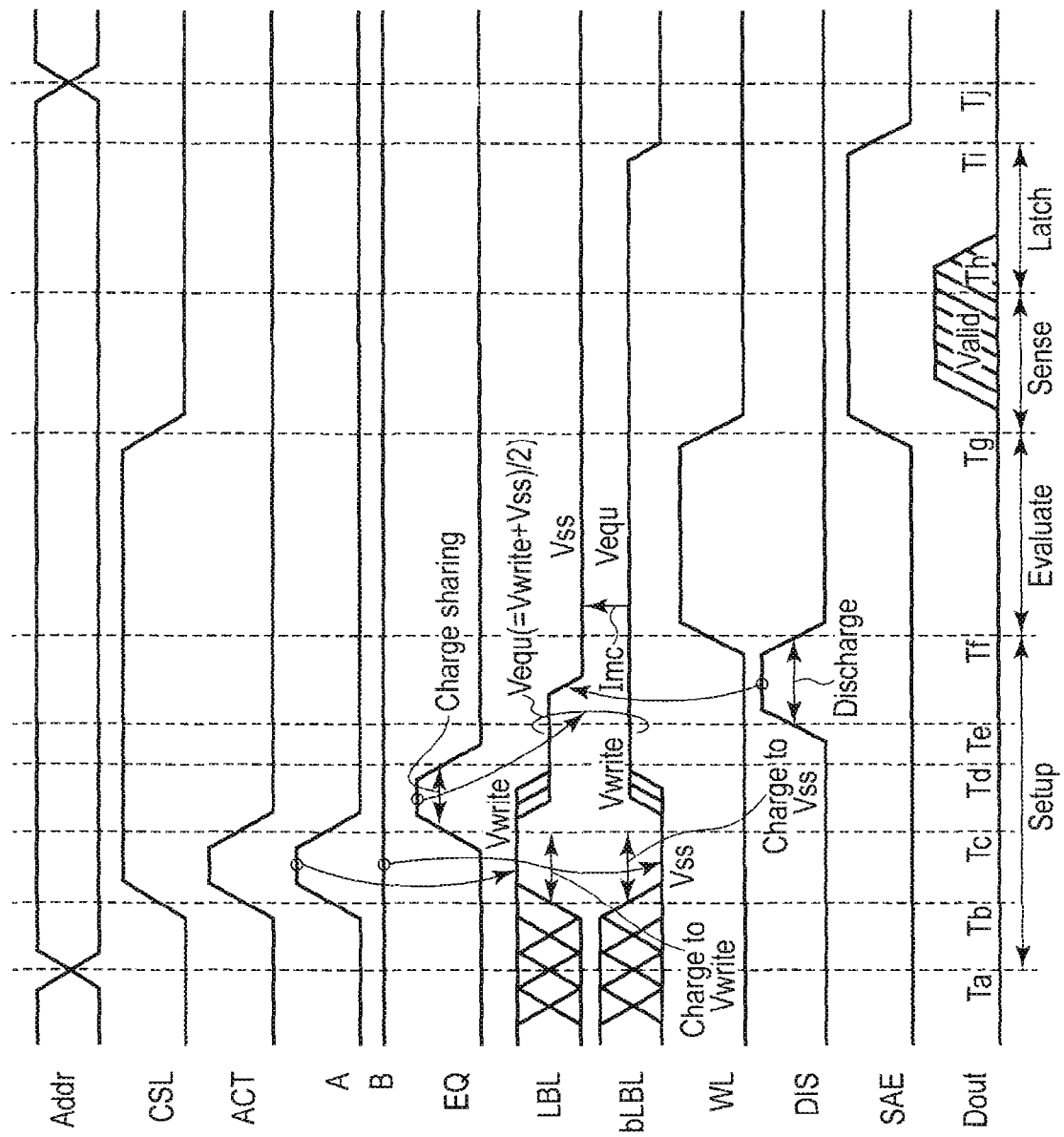
F I G. 17

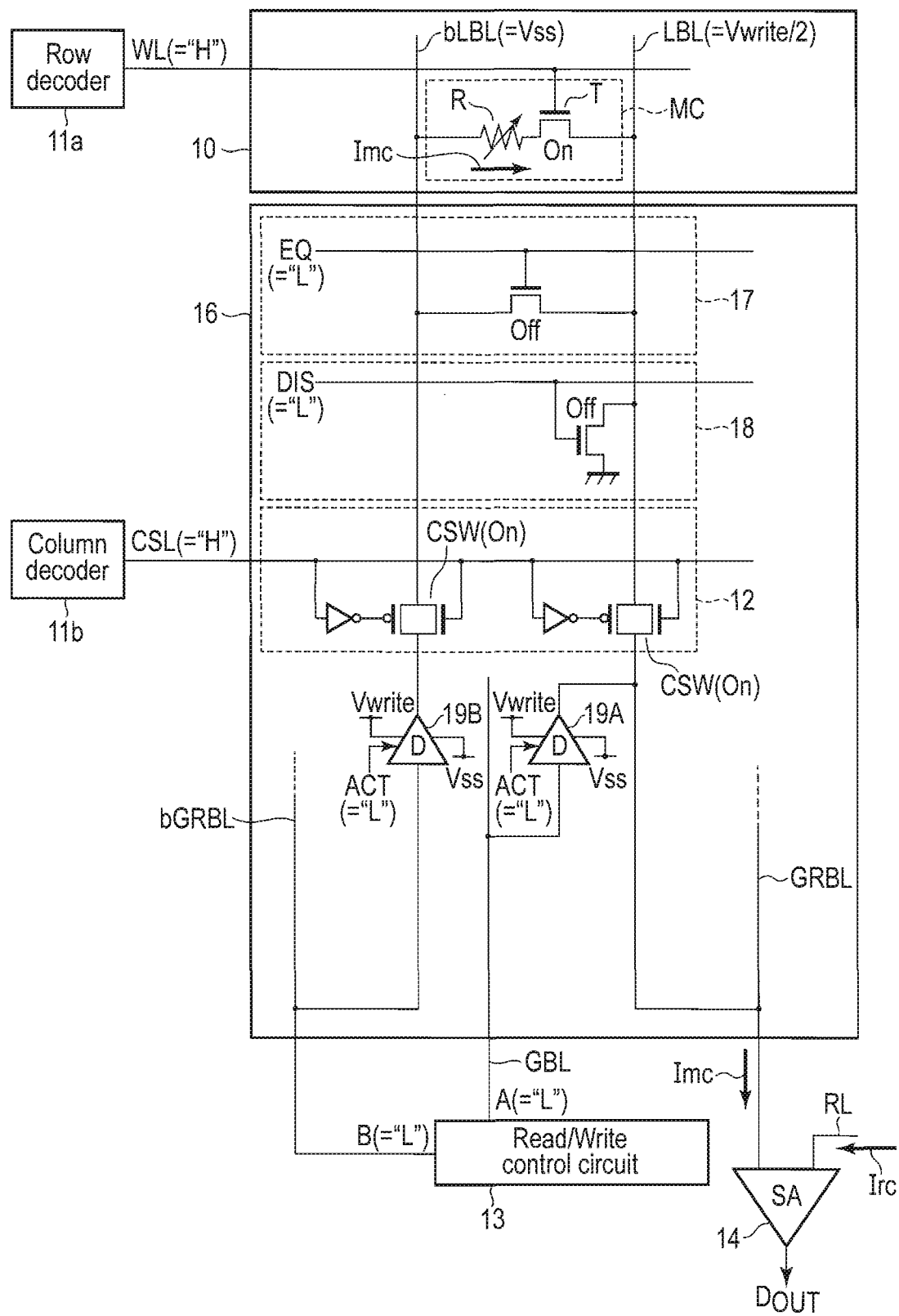
F I G. 21

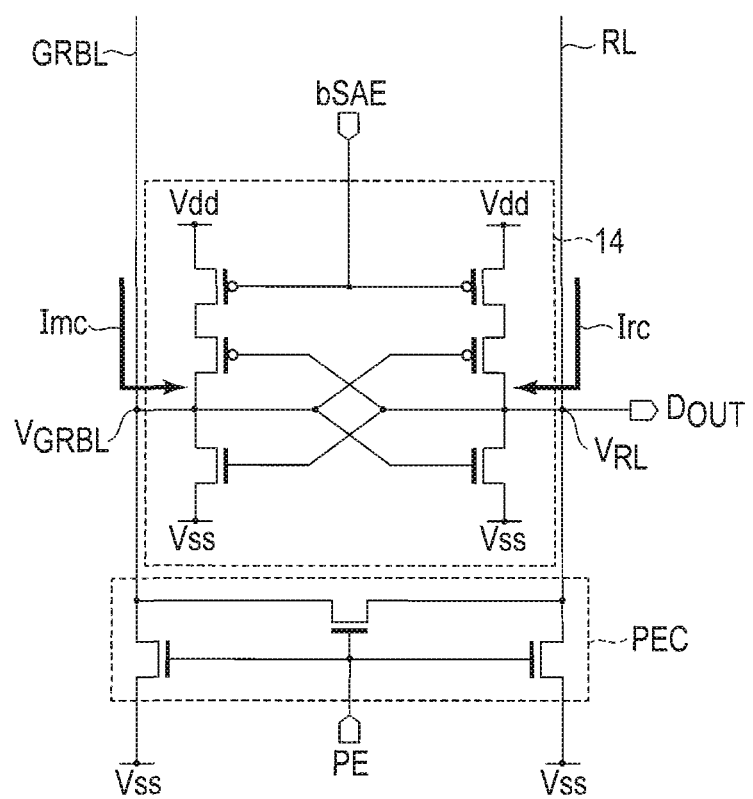
F I G. 22

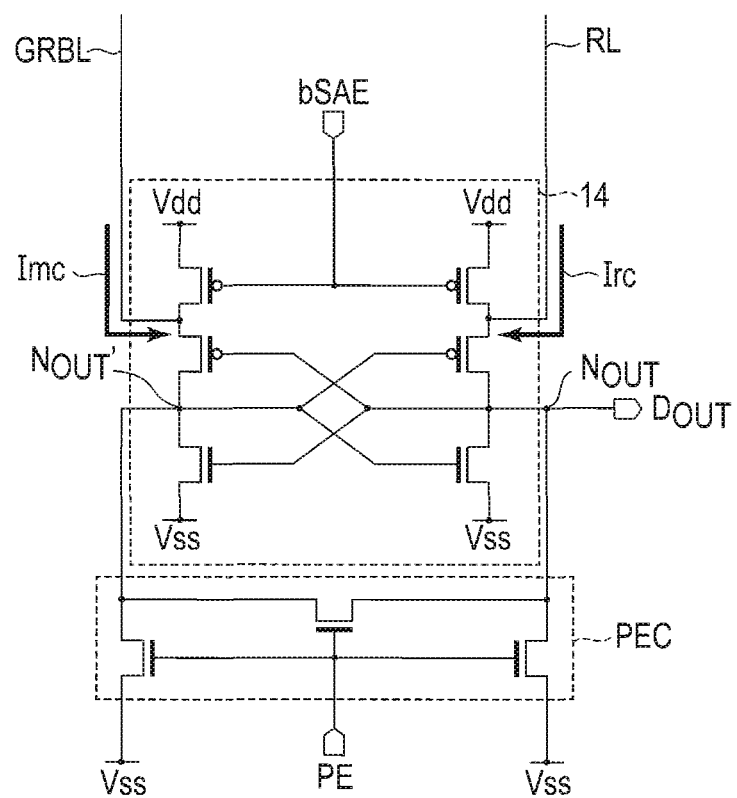
F I G. 23

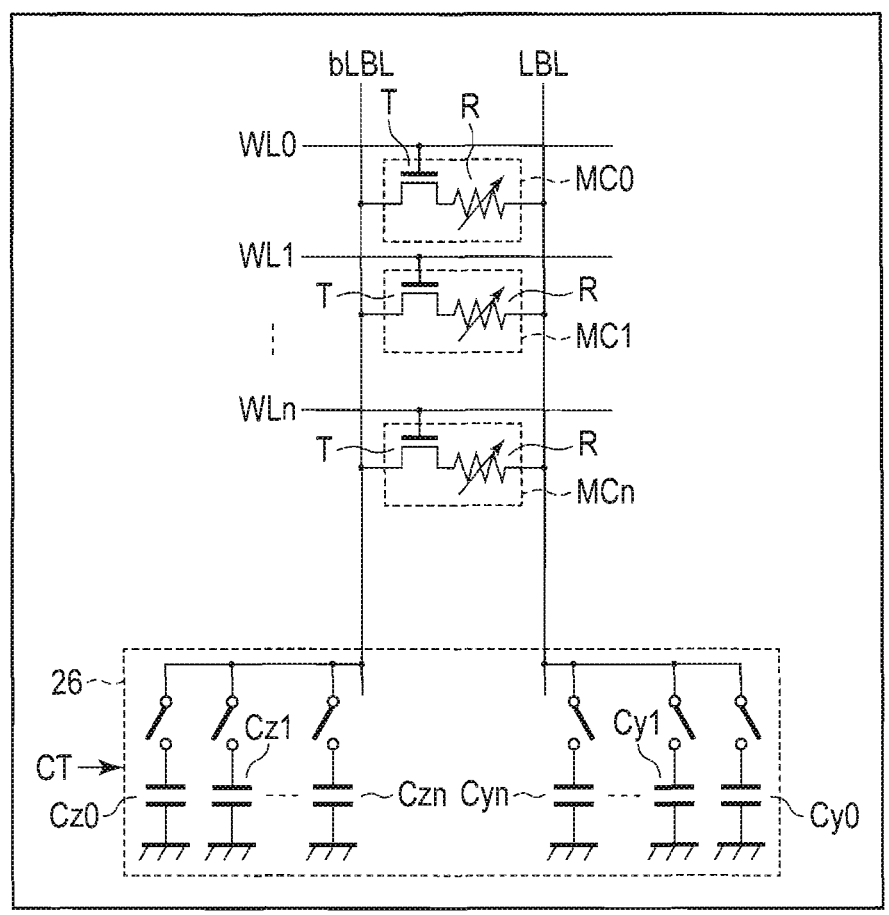
F I G. 29

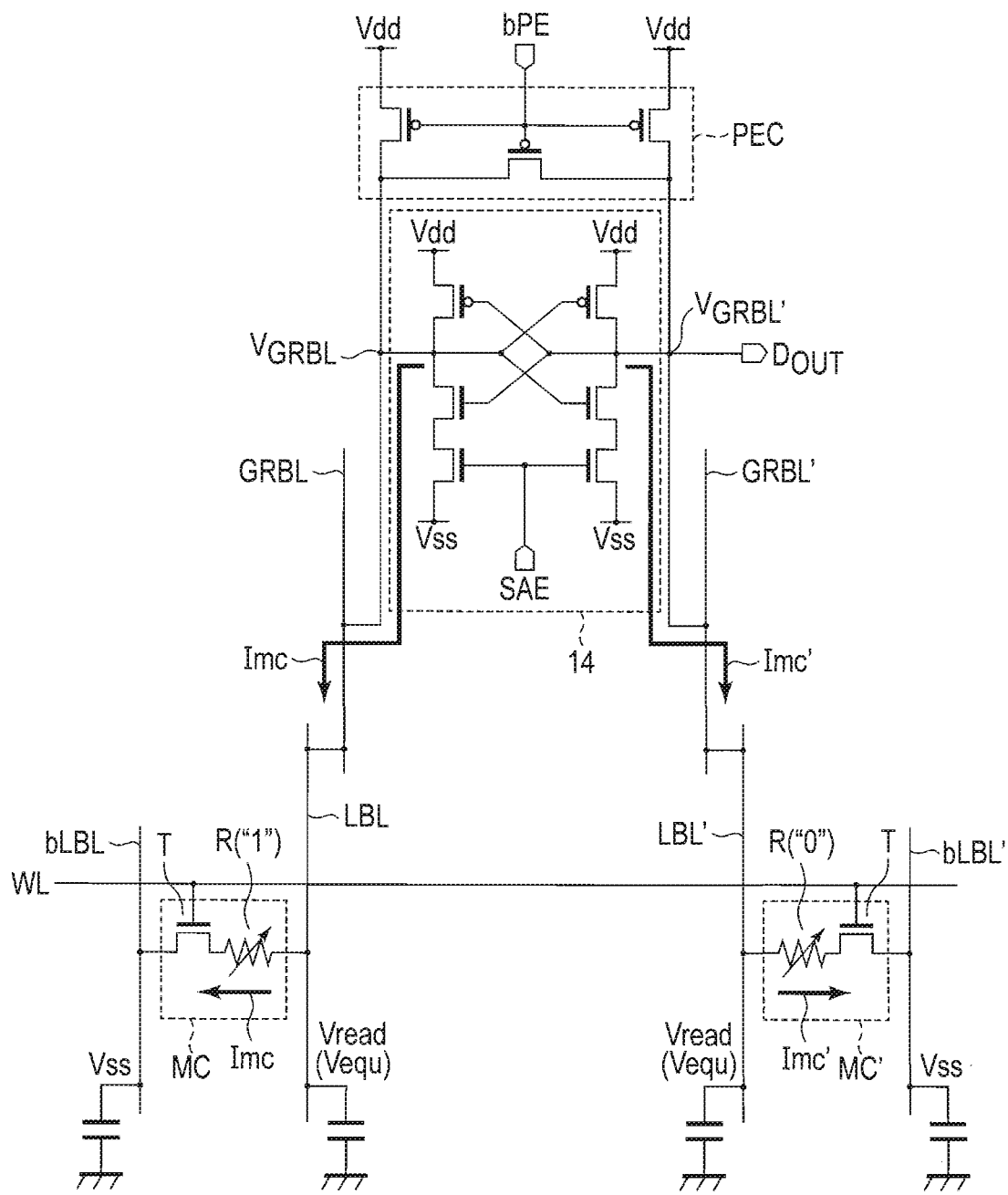
F I G. 30

NONVOLATILE SEMICONDUCTOR MEMORY

CROSS-REFERENCE TO RELATED APPLICATIONS

This application is based upon and claims the benefit of priority from Japanese Patent Application No. 2015-181663, filed Sep. 15, 2015, the entire contents of which are incorporated herein by reference.

FIELD

Embodiments described herein relate generally to a nonvolatile semiconductor memory.

BACKGROUND

A nonvolatile semiconductor memory such as a spin-torque-transfer magnetic random access memory (STT-MRAM) comprises, for example, a memory cell including a resistance-change element and a select transistor (field-effect transistor [FET]) which are connected in series. In such a nonvolatile semiconductor memory, data is written by passing a write current through the resistance-change element and read by passing a read current through the resistance-change element.

This means that the write current and the read current are supplied to the resistance-change element through the same path. In this case, the read current should be less than the write current in order to avoid read disturb (erroneous write) when reading data.

Therefore, the nonvolatile semiconductor memory generally comprises two types of drivers: a write driver which produces the write current and a read driver which produces the read current. However, providing such two types of drivers in the nonvolatile semiconductor memory increases the size of a peripheral circuit of the memory cell and the power consumption.

BRIEF DESCRIPTION OF THE DRAWINGS

FIG. 3 is a circuit diagram showing a peripheral circuit of a first embodiment.
FIG. 5 and FIG. 6 are circuit diagrams each showing an example of a write driver.
FIG. 7 is a flowchart showing an example of a read operation.
FIG. 11 is a circuit diagram showing an example of a step of discharging a bit line.
FIG. 12 is a circuit diagram showing an example of a step of producing a read current.
FIG. 13 and FIG. 14 are circuit diagrams each showing an example of a sense amplifier.
FIG. 15 is a circuit diagram showing a peripheral circuit of a second embodiment.
FIG. 16 is a flowchart showing an example of the read operation.
FIG. 17 is a waveform chart showing an example of read operation.
FIG. 21 is a circuit diagram showing an example of a step of producing a read current.
FIG. 22 and FIG. 23 are circuit diagrams each showing an example of a sense amplifier.
FIG. 24 to FIG. 29 are illustrations each showing a method of producing a read potential of a third embodiment.
FIG. 30 and FIG. 31 are illustrations each showing a read operation of a fourth embodiment.

DETAILED DESCRIPTION

In general, according to one embodiment, nonvolatile semiconductor memory comprises: a resistance-change element having first and second terminals; a transistor having third and fourth terminals and a control terminal, the third terminal electrically connected to the second terminal; and a driver electrically connected to the first and fourth terminals, applying one of a first potential and a second potential to the first terminal and the other of the first and second potentials to the fourth terminal in writing, and applying one of the first and second potentials to the first terminal and the other of the first and second potentials to the fourth terminal in reading.

Embodiments will be hereinafter described with reference to the drawings.

The embodiments are directed to a nonvolatile semiconductor memory in which a write current and a read current are supplied to a memory cell through the same path, i.e., a nonvolatile semiconductor memory having a memory cell in which a resistance-change element and a select transistor (FET) are connected in series, such as an STT-MRAM.

It should be noted that the resistance-change element is an element that can selectively store one of two or more resistance states and includes a magnetoresistive element, a phase-change element and the like. The select transistor is an element for selectively passing a write or read current through the resistance-change element and s also called an access transistor.

Technology of producing both the write current and the read current by the same driver in such a nonvolatile semiconductor memory will be described in the embodiments.

The same driver means a write driver for producing the write current when writing data. The read current is less than the write current and thus produced by using the write driver.

In order to simplify the production of the read current, technology of producing the read current by charge, discharge and charge sharing of bit lines is described in the embodiments.

(Overall View)

Figure 1:
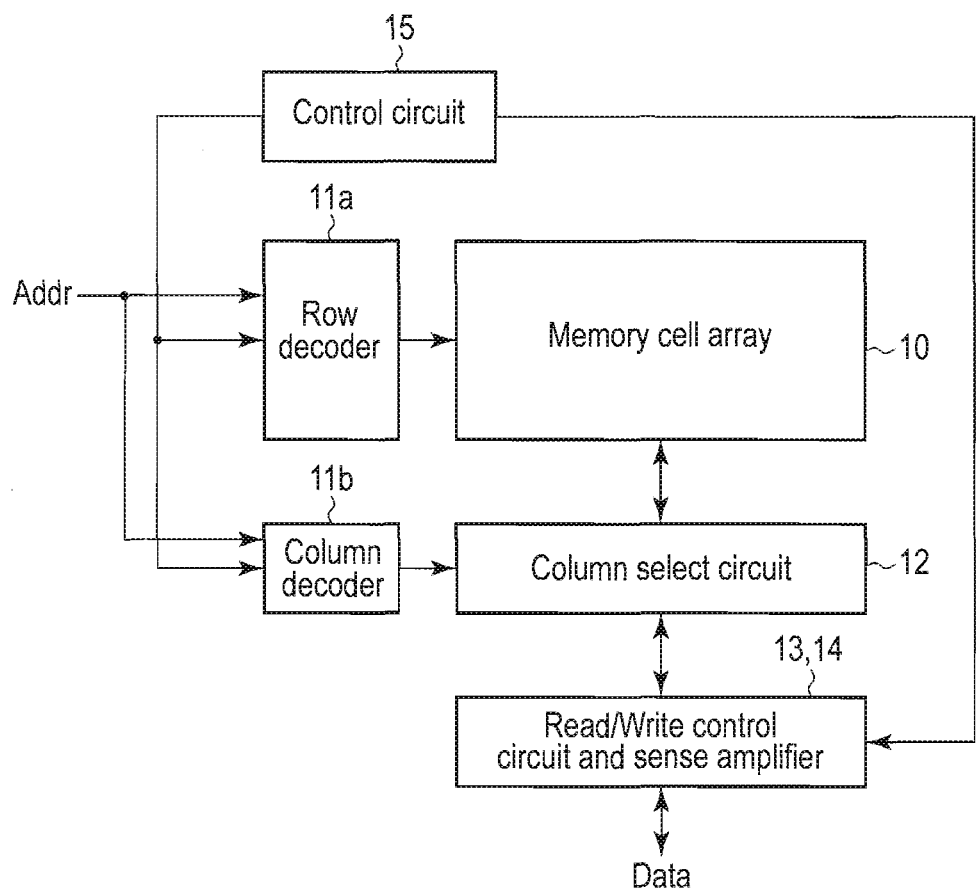
FIG. 1 is a block diagram showing an example of a nonvolatile semiconductor memory.

FIG. 1 shows an example of a nonvolatile semiconductor memory.

A memory cell array 10 comprises an array of memory cells. For example, each memory cell comprises a resistance-change element and a select transistor which are connected in series. A row decoder 11a and a column decoder 11b have a random access to the memory cells in the memory cell array 10 based on an address signal Addr.

A column select circuit 12 has a function of electrically connecting the memory cell array 10 and a sense amplifier 14 based on a column select signal from the column decoder 11b.

A read/write control circuit 13 controls read/write operations.

In a read operation, the read/write control circuit 13 produces a control signal for passing a read current through a selected memory cell in the memory cell array 10. In a write operation, the read/write control circuit 13 produces a control signal for passing a write current through a selected memory cell in the memory cell array 10.

In the read operation, the sense amplifier 14 detects the read current flowing through the selected memory cell, thereby determining data stored in the selected memory cell.

A control circuit 15 controls operations of the row decoder 11a, the column decoder 11b, the read/write control circuit 13 and the sense amplifier 14.

(Memory Cell Array)

Figure 2:
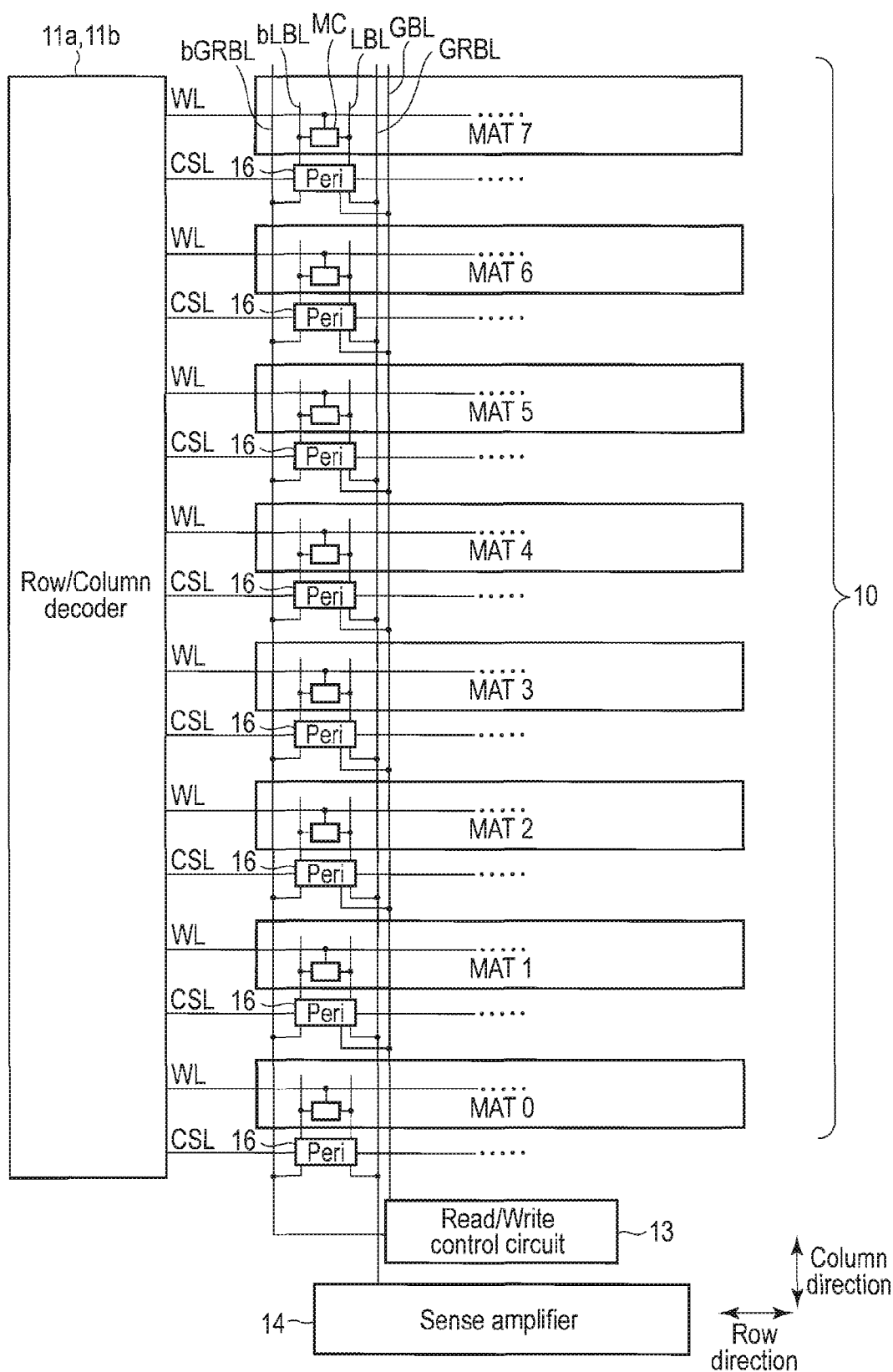
FIG. 2 is a block diagram showing an example of a memory cell array.

FIG. 2 shows an example of the memory cell array.

As an example, a memory cell array having a hierarchical bit line structure is described.

In the nonvolatile semiconductor memory, bit lines become thinner and longer as the memory cells are miniaturized and the memory capacity is increased, with the result that the resistance of the bit lines is increased. To resolve this problem, the following architecture (hierarchical bit line structure) is adopted. The memory cell array is divided into blocks, and low-resistance global read bit lines are arranged on these blocks and connected to local bit lines in each block.

The hierarchical bit line structure makes it possible to shorten a time period (latency) from when an instruction to perform a read operation is issued to when data becomes ready to be read from the sense amplifier. Therefore, adopting the hierarchical bit line structure in the nonvolatile semiconductor memory is very effective in applying the nonvolatile semiconductor memory to, for example, a cache memory that requires high-speed access.

The memory cell array 10 comprises blocks MAT0 to MAT7 aligned in the column direction. Eight blocks MAT0 to MAT7 are provided in the present embodiment, but the number of blocks is not limited to eight and may be, for example, four, sixteen or thirty two.

Blocks MAT0 to MAT7 include memory cells MC. Each memory cell MC includes a resistance-change element (for example, a magnetoresistance-change element) and a select transistor which are connected in series.

The row/column decoders 11a and 11b are arranged at one end of the memory cell array 10 in the row direction. Word lines WL and column select lines CSL extend from the row/column decoders 11a and 11b in the row direction. The memory cells MC are selected by the word lines WL and the column select lines CSL. For example, one of the word lines WL is selected and one of the column select lines CSL is selected.

Global read bit lines GRBL and bGRBL and a global bit line GBL extend in the column direction in the memory cell array 10. One end of the global read bit line GRBL is connected to the sense amplifier 14. One end of the global read bit line bGRBL and one end of the global bit line GBL are connected to the read/write control circuit 13.

Local bit lines LBL and bLBL are arranged in blocks MAT0 to MAT7 and extend in the column direction. The memory cells MC are connected between local bit lines LBL and bLBL.

The sense amplifier 14 is arranged at one end of the memory cell array 10 in the column direction. The sense amplifier 14 determines data stored in the memory cells MC, for example, based on a read current flowing through the global read bit line GRBL.

Peripheral circuits (Peri) 16 are connected between local bit lines LBL and bLBL and the global read bit lines GRBL and bGRBL. The peripheral circuits 16 are arranged between or close to blocks MAT0 to MAT7.

First Embodiment

FIG. 3 shows a peripheral circuit of the first embodiment.

A column select circuit 12 includes a transfer gate connected to local bit lines LBL and bLBL. In the present embodiment, the transfer gate comprises an N-channel transistor (for example, an FET) and a P-channel transistor (for example, an FET). However, the transfer gate may comprise only the N-channel transistor.

The transfer gate in the column select circuit 12 is turned on if a column select signal CSL from a column decoder 11b goes high.

An equalizing circuit 17 comprises an N-channel transistor (for example, an PET) connected between local bit lines LBL and bLBL. The equalizing circuit 17 is turned on if an equalizing signal EQ goes high. When the equalizing signal EQ is high, the potentials of local bit lines LBL and bLBL are equalized.

A discharge circuit 18 comprises an N-channel transistor (for example, an FET) connected to local bit line bLBL. The discharge circuit 18 is turned on if a discharge signal DIS goes high. When the discharge signal DIS is high, local bit line bLBL is discharged.

In the present embodiment, local bit line bLBL connected to the discharge circuit 18 functions as a source line (a conductive line into which a read current flows) in a read operation.

In this case, it is preferable that a resistance-change element R in a memory cell MC is arranged on local bit line LBL (a conductive line from which the read current flows) side, and a select transistor T in the memory cell MC is arranged on the local bit line bLBL side as shown in FIG. 3.

This is because when a read current Imc flows from local bit line LBL to local bit line bLBL, the saturation of the read current caused by the body effect can be avoided by setting the source (S) of the select transistor T to the potential of local bit line bLBL (for example, ground potential Vss).

A word line WL is connected to the gate of the select transistor T in the memory cell MC. When a select signal $V_{WL}$ from a row decoder 11a is high, the select transistor T is turned on and a read/write current flows into the resistance-change element R.

A write driver 19A is connected between a global bit line GBL and local bit line LBL. In a write operation, write driver 19A is enabled (activated) and sets the potential of local bit line LBL to a write potential Vwrite (for example, 1.2 to 1.4 V) or ground potential Vss.

A write driver 19B is connected between a global read bit line bGRBL and local bit line bLBL. In the write operation, write driver 19B is enabled and sets the potential of local bit line bLBL to the write potential Vwrite or ground potential Vss.

For example, in the write operation, write drivers 19A and 19B are enabled if a control signal ACT goes high, and disabled (deactivated) if control signal ACT goes low.

In the write operation, if control signal ACT is high and the read/write control circuit 13 outputs high as a control signal A and low as a control signal B, write driver 19A sets local bit line LBL to Vwrite and write driver 19B sets local bit line bLBL to Vss. At this time, the write current flows from local bit line LBL to local bit line bLBL.

As a result, the resistance of the resistance-change element R is changed to, for example, a high-resistance state (binary 1 state).

In the write operation, if control signal ACT is high and the read/write control circuit 13 outputs low as control signal A and high as control signal B, write driver 19A sets local bit line LBL to Vss and write driver 19B sets local bit line bLBL to Vwrite. At this time, the write current flows from local bit line bLBL to local bit line LBL.

As a result, the resistance of the resistance-change element R is changed to, for example, a low-resistance state (binary 0 state).

In the present embodiment, write drivers 19A and 19B are temporarily enabled also in a read operation and set one of local bit lines LBL and bLBL to the write potential Vwrite and the other of local bit lines LBL and bLBL to ground potential Vss.

For example, in the read operation, write drivers 19A and 19B are enabled if control signal ACT goes high and disabled if control signal ACT goes low.

In the read operation, if control signal ACT is high and the read/write control circuit 13 outputs high as control signal A and low as control signal B, write driver 19A charges local bit line LBL to Vwrite and write driver 19B charges local bit line bLBL to Vss.

In the read operation, if control signal ACT is high and the read/write control circuit 13 outputs low as control signal A and high as control signal B, write driver 19A charges local bit line LBL to Vss and write driver 19B charges local bit line bLBL to Vwrite.

After that, the equalizing circuit 17 performs an equalizing (charge sharing) operation and the discharge circuit 18 performs a discharge operation. A read potential Vread is thereby produced and preparations for producing a read current Imc are finished. This will be explained in detail in the description of the read operation.

The sense amplifier (SA) 14 outputs an output potential Gout according to data stored in the resistance-change element R in the memory cell MC, based on the read current Imc flowing through the global read bit line GRBL and a reference current Irc flowing through a reference line RL. The sense amplifier 14 may be either a voltage-sensing type or a current-sensing type as described later.

The present embodiment is based on the assumption that the nonvolatile semiconductor memory is a 1 cell/1 bit type in which one bit is stored in one memory cell, but a 2 cell/1 bit type in which one bit (complementary data) is stored in two memory cells may be used instead. In the latter case, Irc can be produced by a circuit for producing. Imo.

Figure 4A:
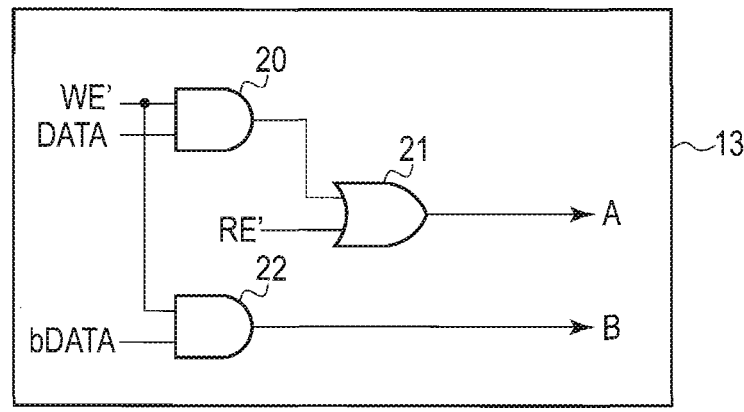
FIG. 4A and FIG. 4B are circuit diagrams each showing an example of a read/write control circuit.
Figure 4B:
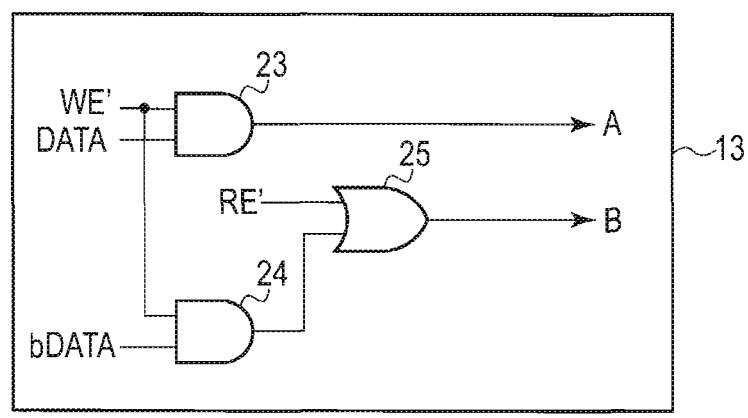

FIG. 4A and FIG. 4B show examples of the read/write control circuit.

FIG. 4A is a circuit example for charging local bit line LBL to Vwrite by write driver 19A and charging local bit line bLBL to Vss by write driver 19B in the read operation.

A write enable signal WE' and data (write data) DATA are input to an AND gate circuit 20. An output signal of the AND gate circuit 20 is input to an OR gate circuit 21. A read enable signal RE' is also input to the OR gate circuit 21. An output signal of the OR gate circuit 21 becomes a control signal A (corresponding to control signal A of FIG. 3).

The write enable signal WE' and an inverted signal bDATA of the data DATA are input to an AND gate circuit 22. An output signal of the AND gate circuit 22 becomes a control signal B (corresponding to control signal B of FIG. 3).

In the write operation, the write enable signal WE' is high and the read enable signal RE' is low. When the data DATA is 1 (=high), control signal A is high and control signal B is low. When the data DATA is 0 (=low), control signal A is low and control signal B is high.

In the read operation, the write enable signal WE' is low and the read enable signal RE' is high. Accordingly, control signal A is high and control signal B is low.

FIG. 4B is a circuit example for charging local bit line LBL to Vss by write driver 19A and charging local bit line bLBL to Vwrite by write driver 19B in the read operation.

A write enable signal WE' and data (write data) DATA are input to an AND gate circuit 23. An output signal of the AND gate circuit 23 becomes a control signal A (corresponding to control signal A of FIG. 3).

The write enable signal WE' and an inverted signal bDATA of the data DATA are input to an AND gate circuit 24. An output signal of the AND gate circuit 24 is input to an OR gate circuit 25. A read enable signal RE' is also input to the OR gate circuit 25. An output signal of the OR gate circuit 25 becomes a control signal B (corresponding to control signal B of FIG. 3).

In the write operation, the write enable signal WE' is high and the read enable signal RE' is low. When the data DATA is 1 (=high), control signal A is high and control signal B is low. When the data DATA is 0 (=low), control signal A is low and control signal B is high.

In the read operation, the write enable signal WE' is low and the read enable signal RE' is high. Accordingly, control signal A is low and control e B is high.

FIG. 5 and FIG. 6 show examples of the write driver.

FIG. 5 corresponds to write driver 19A of FIG. 3 and FIG. 6 corresponds to write driver 19B of FIG. 3.

Each of write drivers 19A and 19B comprises P-channel transistors (FETs) P1 and P2 and N-channel transistors (FETs) N1 and N2 which are connected in series between a first terminal (Vwrite) and a second terminal (toss). Inverted signals bA and bB of input signals A and B (i.e., output signals of inverters I1) are input to the gates of respective P-channel transistors P1 and the gates of respective N-channel transistors N1, and output signals CUT are output from the drains of respective P-channel transistors P1 and the drains of respective N-channel transistors N1.

Control signal ACT is input to the gates of the N-channel transistors N2, and inverted signals of control signal ACT (i.e., output signals of the inverters 12) are input to the gates of respective P-channel transistors P2.

Next, an example of the read operation is described with reference to FIG. 7 to FIG. 12.

Figure 8:
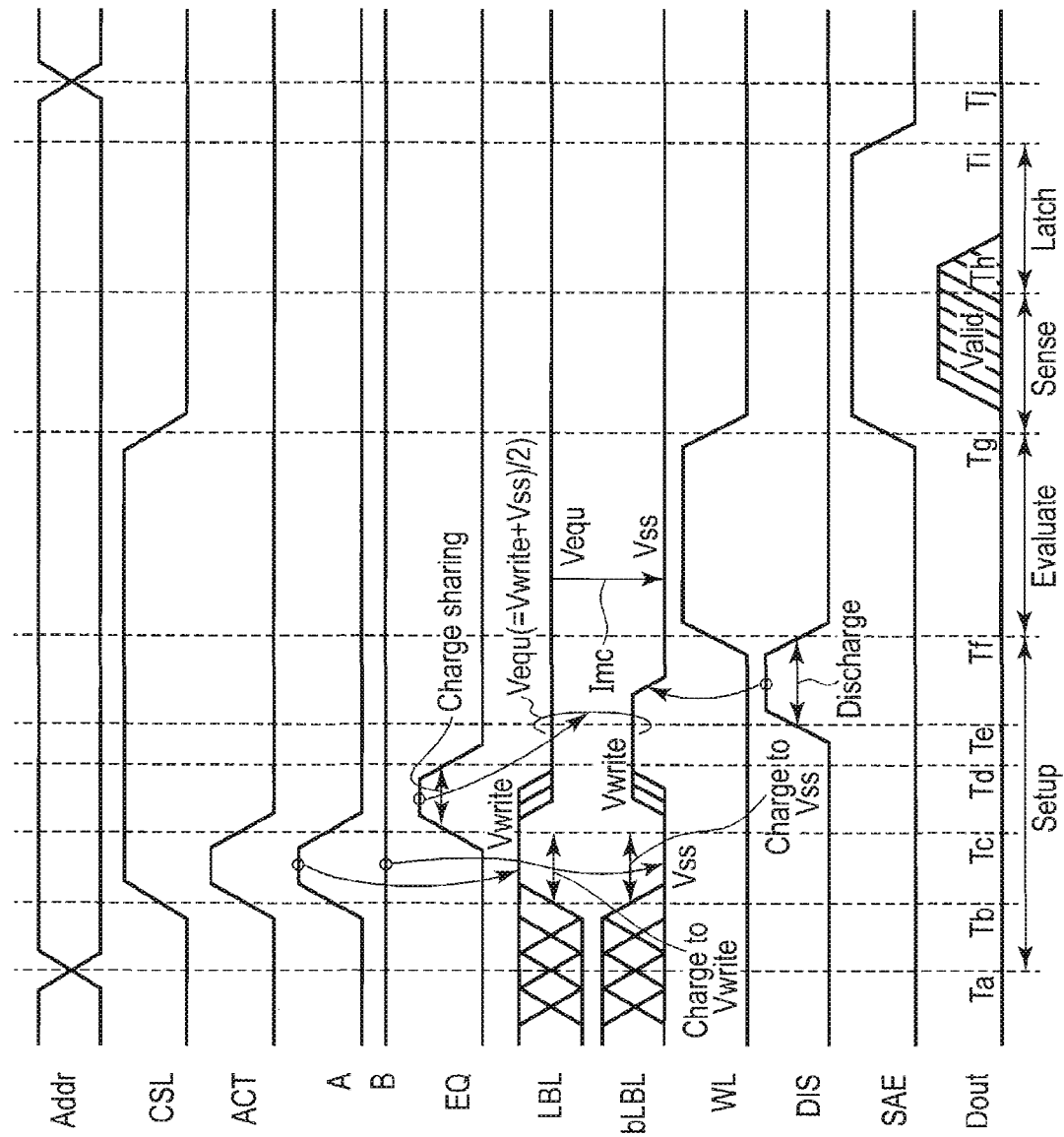
FIG. 8 is a waveform chart showing an example of the read operation.

FIG. 7 shows a flowchart of the read operation, FIG. 8 shows waveforms of the read operation and FIG. 9 to FIG. 12 show states of the peripheral circuit in respective steps of the read operation.

The read operation includes four steps: setup, evaluation, sensing and latching.

A step of setup includes an operation of setting the potential of the pair of bit lines LBL and bLBL, i.e., an operation of producing a read potential Vread from the write potential Vwrite.

First, at time Ta, an address signal Addr is enabled and the row decoder and the column decoder execute processing of decoding the address signal Addr.

At time Tb, processing of selecting a column based on the address signal Addr is finished and a column select signal CSL is made high in the selected column. As a result, write driver 19A is connected to local bit line LBL and write driver 19B is connected to local bit line bLBL in the selected column.

In addition, control signal ACT goes high and write drivers 19A and 19B are enabled. Control signal A goes high and control signal B goes low (in the case of using the read/write control circuit of FIG. 4A).

Figure 9:
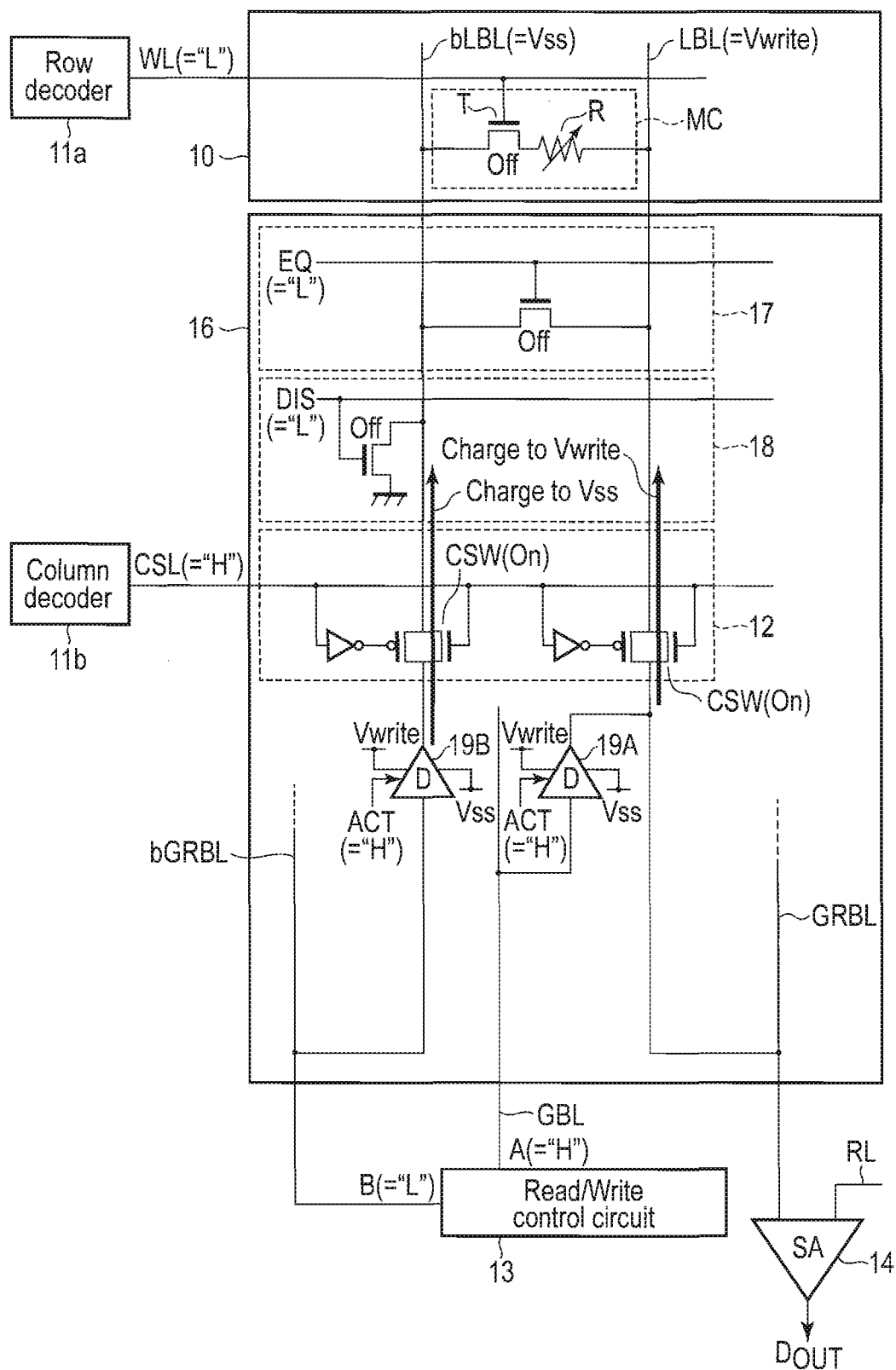
FIG. 9 is a circuit diagram showing an example of a step of charging bit lines.

As a result, local bit line LBL is charged to Vwrite by write driver 19A and local bit line bLBL is charged to Vss by write driver 19B as shown in FIG. 9 (step ST11 of FIG. 7).

After that, control signal ACT goes low and write drivers 19A and 19B are disabled. Thus, local bit line LBL floats while at Vwrite and local bit line bLBL floats while at Vss.

Figure 10:
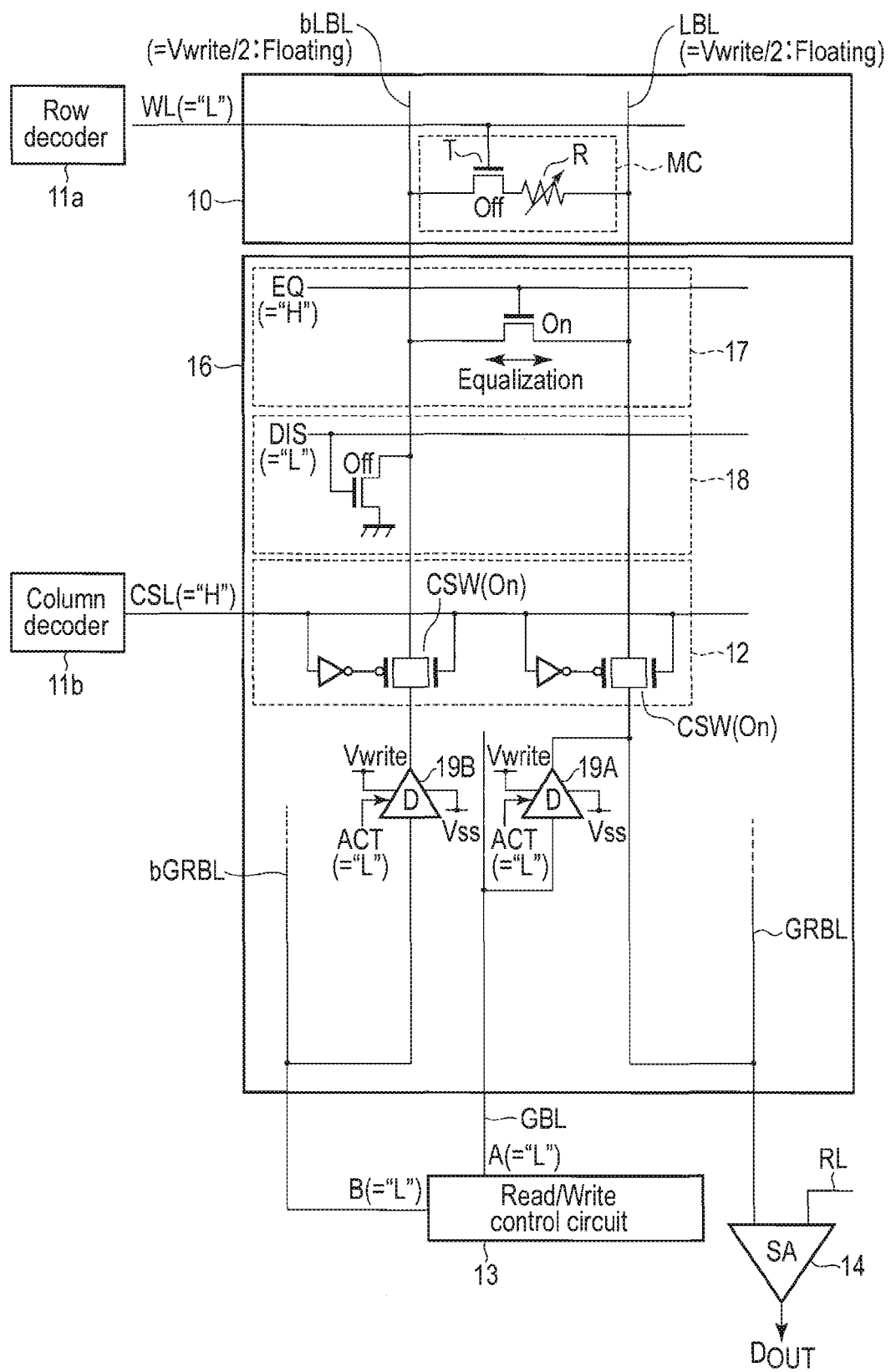
FIG. 10 is a circuit diagram showing an example of a step of equalizing bit lines.

Next, from time Tc to time Td, an equalizing signal EQ temporarily goes high, two local bit lines LBL and bLBL are shorted as shown in FIG. 10 and charge sharing is performed between these local bit lines LBL and bLBL (step ST12 of FIG. 7).

That is, the potentials of local bit lines LBL and bLBL are equalized to Vequ (=(Vwrite+Vss)/2) by capacitance coupling. For example, if Vss is ground potential (0 V), local bit lines LBL and bLBL float while at Vwrite/2.

Next, from time Te to time Tf, a discharge signal DIS temporarily goes high and one of two local bit lines LBL and bLBL (in the present embodiment, local bit line bLBL) is discharged to ground potential Vss as shown in FIG. 11 (step ST13 of FIG. 7).

As a result, for example, local bit line LBL floats while at Vwrite/2 and local bit line bLBL floats while at Vss. The operation of producing the read potential Vread (=Vequ) from the write potential Vwrite is thereby completed and preparations for passing the read current are finished.

A time period from Ta to Tf during which the above setup is executed can be equal to or less than that in the case of producing the read potential Vread using a conventional read driver.

This is because the conventional read driver has less drive power than a write driver and a relatively long time is required to stabilize the bit line pair at a certain potential necessary for the read operation, whereas the write driver can charge the bit line pair rapidly and the read potential can be produced in a short time by charge sharing.

A time required for charge, discharge and charge sharing of the pair of bit lines LBL and bLBL is less than one nanosecond and can be concealed in a time period during which processing of row selection is executed based on the address signal Addr.

Next, evaluation is executed from time Tf to time Tg.

When a word line WL is made high at time Tf, a read current Imc flows from local bit line LBL to local bit line bLBL as shown in FIG. 12. As a result, the potential of a global read bit line GRBL can be evaluated by the sense amplifier 14 (steps ST14 and ST15 of FIG. 7).

Next, sensing and latching are executed from time Tg to time Ti.

Sensing and latching are executed by making a sense amplifier enable signal SAE high (steps ST16 and ST17 of FIG. 7).

That is, the sense amplifier 14 is enabled and outputs an output potential Dout according to data stored in the resistance-change element R in the memory cell MC based on the read current Imc flowing through the global read bit line GRBL and the reference current Irc flowing through the reference line RL.

After that, the read operation is completed at time Tj.

Figure 13:
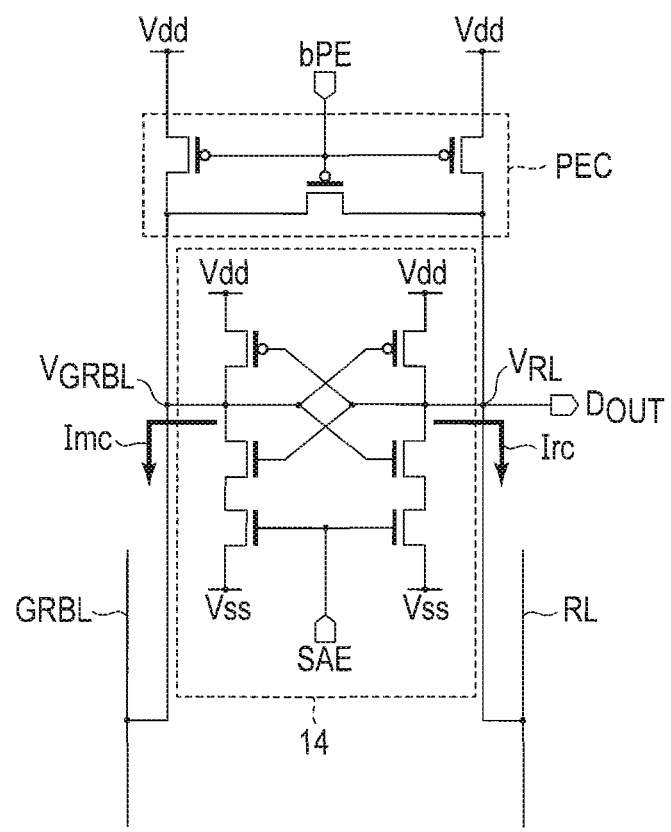

FIG. 13 shows a first example of the sense amplifier.

This sense amplifier 14 is a voltage-sensing type.

The sense amplifier 14 is enabled if a control signal SAE goes high. In this example, the sense amplifier 14 can evaluate a potential $V_{GRBL}$ of the global read bit line GRBL and a potential $V_{RL}$ of the reference line RL by a P-channel transistor in the sense amplifier 14 even before the sense amplifier 14 is enabled.

The step of evaluation in the above-described read operation corresponds to evaluation by the P-channel transistor in the sense amplifier 14 before the sense amplifier enable signal SAE goes high.

If the sense amplifier 14 is enabled, a latch circuit formed by the P-channel transistor and an N-channel transistor in the sense amplifier 14 sense and latch data stored in the memory cell MC of FIG. 3. The sense amplifier 14 outputs the output potential $D_{OUT}$ according to the data stored in the memory cell MC of FIG. 3.

A precharge/equalizing circuit PEC resets the potential $V_{GRBL}$ of the global read bit line GRBL and the potential $V_{RL}$ of the reference line RL before the sense amplifier 14 executes sensing and latching. If a control signal bPE is low, the global read bit line GRBL and the reference line RL are set to, for example, a power-supply potential Vdd.

FIG. 14 shows a second example of the sense amplifier.

This sense amplifier 14 is a current-sensing type.

The sense amplifier 14 is enabled if control signal SAE goes high.

If the sense amplifier 14 is enabled, a latch circuit formed by a P-channel transistor and an N-channel transistor in the sense amplifier 14 sense and latch data stored in the memory cell MC of FIG. 3. The sense amplifier 14 outputs the output potential $D_{OUT}$ according to the data stored in the memory cell MC of FIG. 3.

A precharge/equalizing circuit PEC resets nodes $N_{OUT}$ and $N_{OUT}'$ before the sense amplifier 14 executes sensing and latching. If a control signal bPE is low, nodes $N_{OUT}$ and $N_{OUT}'$ are set to, for example, a power-supply potential Vdd.

As described above, according to the nonvolatile semiconductor memory of the first embodiment, the size of the peripheral circuit of the memory cell and the power consumption can be reduced by producing both the write potential and the read potential by the same driver. In addition, since the read potential is produced from the write potential, it is not necessary to input the read potential from the outside of the chip or produce the read potential independently of the write potential.

Therefore, a large-capacity, energy-efficient nonvolatile semiconductor memory capable of reading data at high speed can be implemented.

Second Embodiment

FIG. 15 shows a peripheral circuit of the second embodiment.

The second embodiment is a modified embodiment of the first embodiment (FIG. 3).

The second embodiment is different from the first embodiment in the direction of the read current Imc. That is, the read current flows from local bit line LBL to local bit line bLBL in the first embodiment, but the read current flows from local bit line bLBL to local bit line LBL in the second embodiment.

The column select circuit 12, the read/write control circuit 13, the equalizing circuit 17 and write drivers 19A and 19B are the same as those described in the first embodiment and thus detailed description thereof is omitted.

For example, the read/write control circuit 13 can be implemented by the examples of FIG. 4A and FIG. 4B. For example, write driver 19A can be implemented by the example of FIG. 5 and write driver 19B can be implemented by the example of FIG. 6.

In the peripheral circuit 16 of the present embodiment, the discharge circuit 18 comprises an N-channel transistor (for example, an FET) connected to local bit line LBL. The discharge circuit 18 is turned on if a discharge signal DIS goes high. Local bit line LBL is discharged when the discharge signal DIS is high.

Local bit line LBL connected to the discharge circuit 18 functions as a source line (a conductive line into which the read current flows) in the read operation.

In this case, it is preferable that the resistance-change element R in the memory cell MC is arranged on the local bit line bLBL (a conductive line from which the read current flows) side, and the select transistor T in the memory cell MC is arranged on the local bit line LBL side as shown in FIG. 15.

This is because when the read current Imc flows from local bit line bLBL to local bit line LBL, the saturation of the read current caused by the body effect can be avoided by setting the source (S) of the select transistor T to the potential of local bit line LBL (for example, ground potential Vss).

In the write operation, write drivers 19A and 19B set one of local bit lines LBL and bLBL to the write potential Vwrite (for example, 1.2 to 1.4 V) and the other to ground potential Vss. This is the same as the first embodiment and thus detailed description is omitted.

In the read operation, too, write drivers 19A and 19B set one of local bit lines LBL and bLBL to the write potential Vwrite and the other to ground potential Vss. This is also the same as the first embodiment and thus detailed description is omitted.

After that, the equalizing circuit 17 performs an equalizing (charge sharing) operation and the discharge circuit 18 performs a discharge operation. A read potential Vread is thereby produced and preparations for producing the read current Imc are finished.

In the second embodiment, however, local bit line LBL is discharged. Accordingly, the read current Imc flows from local bit line bLBL to local bit line LBL.

The sense amplifier (SA) 14 outputs an output potential Dout according to data stored in the resistance-change element R in the memory cell MC, based on the read current Imc flowing through the global read bit line GRBL and a reference current Irc flowing through a reference line RL.

The present embodiment is also based on the assumption that the nonvolatile semiconductor memory is a 1 cell/1 bit type in which one bit is stored in one memory cell, but a 2 cell/1 bit type in which one bit (complementary data) is stored in two memory cells may be used instead. In the latter case, Irc can be produced by a circuit for producing Imc.

Next, an example of the read operation is described with reference to FIG. 16 to FIG. 21.

FIG. 16 shows a flowchart of the read operation, FIG. 17 shows waveforms of the read operation and FIG. 18 to FIG. 21 show states of the peripheral circuit in respective steps of the read operation.

The read operation includes four steps: setup, evaluation, sensing and latching.

A step of setup includes an operation of setting the potential of the pair of bit lines pair LBL and bLBL, i.e., an operation of producing the read potential Vread from the write potential Vwrite.

First, at time Ta, an address signal Addr is enabled and the row decoder and the column decoder execute processing of decoding the address signal Addr.

At time Tb, processing of selecting a column based on the address signal Addr is finished and a column select signal CSL is made high in the selected column. As a result, write driver 19A is connected to local bit line LBL and write driver 19B is connected to local bit line bLBL in the selected column.

In addition, control signal ACT goes high and write drivers 19A and 19B are enabled. Control signal A goes high and control signal B goes low (in the case of using the read/write control circuit of FIG. 4A).

Figure 18:
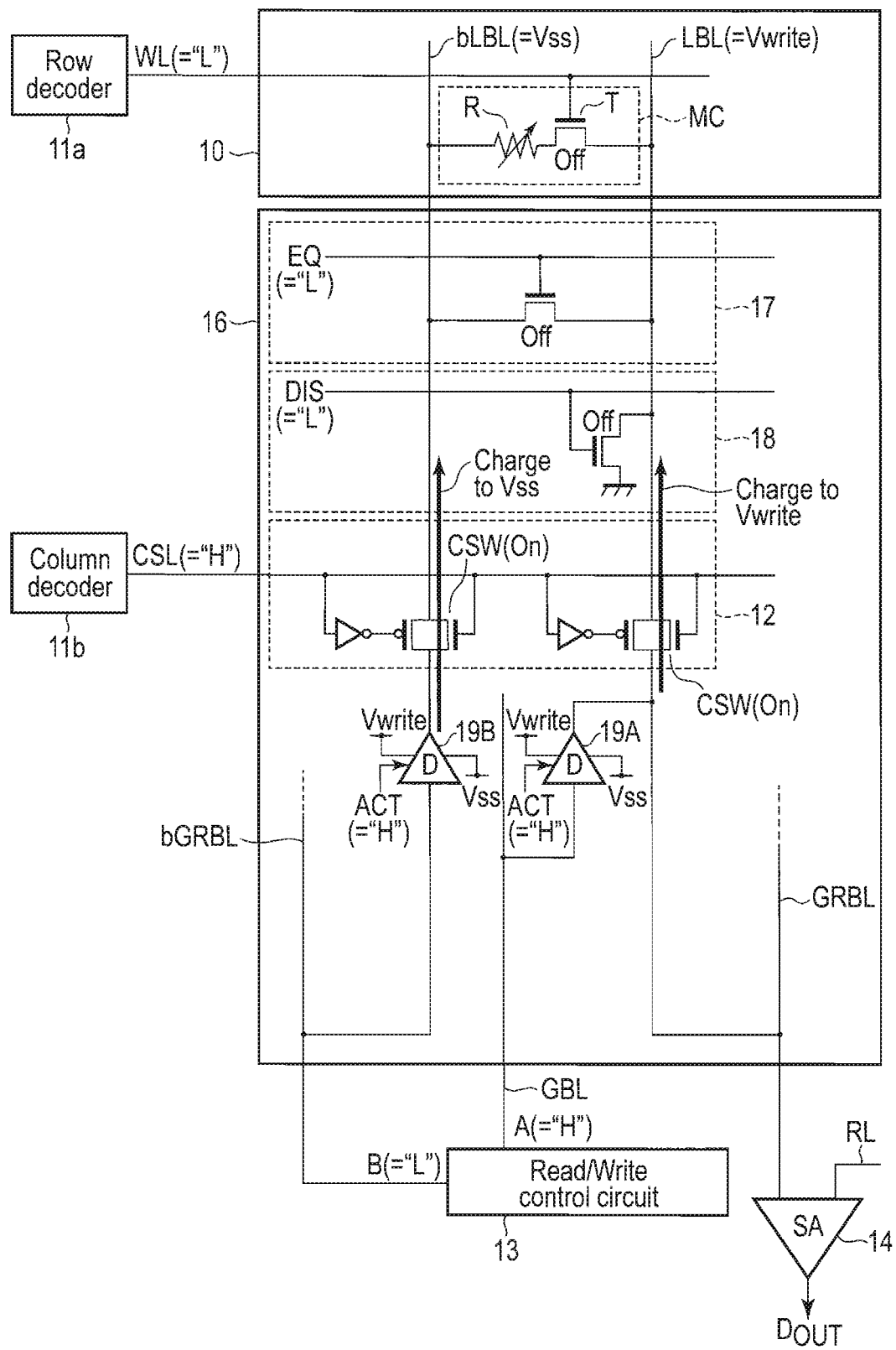
FIG. 18 is a circuit diagram showing an example of a step of charging bit lines.

As a result, local bit line LBL is charged to Vwrite by write driver 19A and local bit line bLBL is charged to Vss by write driver 19B as shown in FIG. 18 (step ST21 of FIG. 16).

After that, control signal ACT goes low and write drivers 19A and 19B are disabled. Thus, local bit line LBL floats while at Vwrite and local bit line bLBL floats while at Vss.

Figure 19:
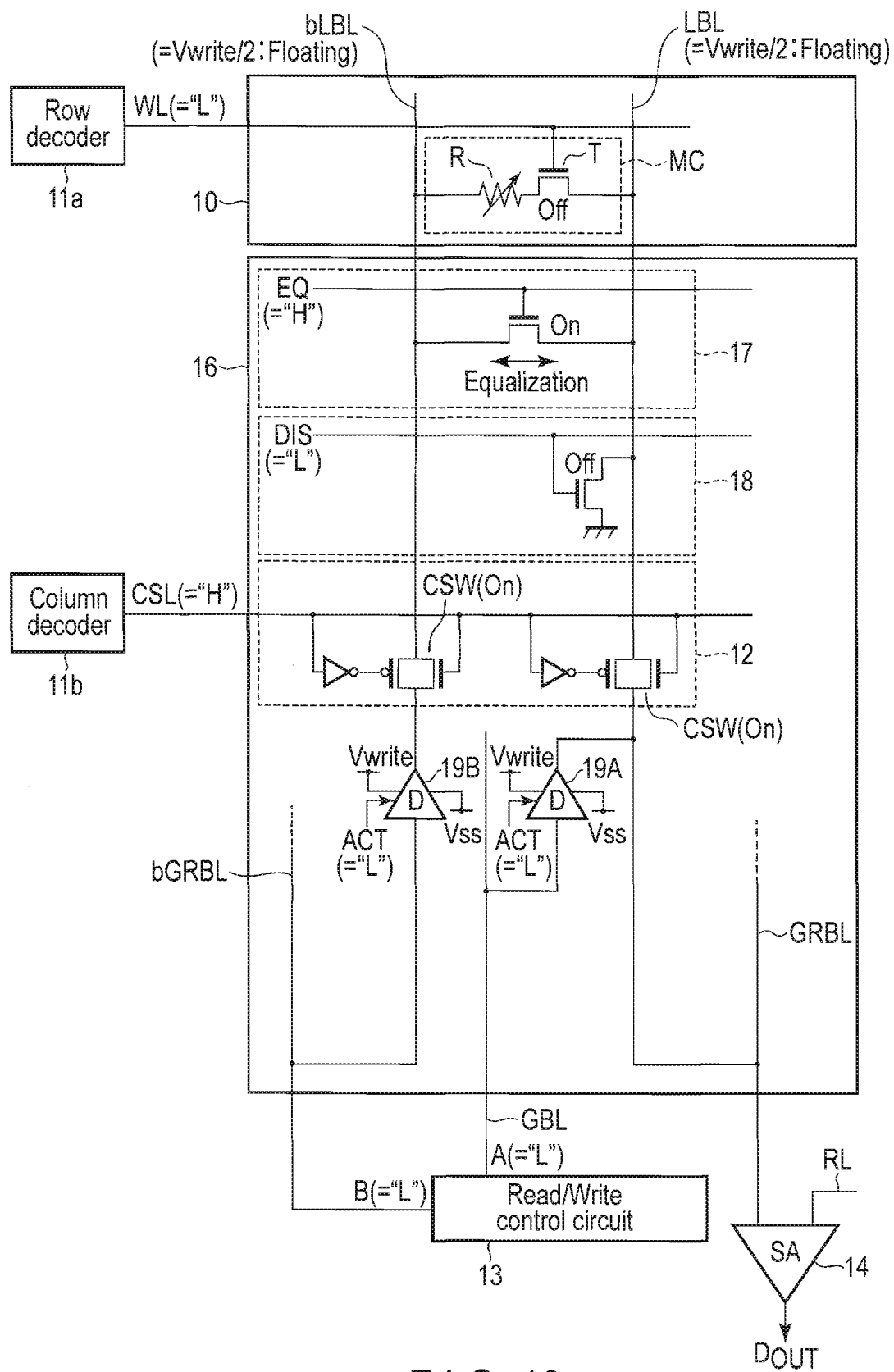
FIG. 19 is a circuit diagram showing an example of a step of equalizing bit lines.

Next, from time Tc to time Td, an equalizing signal EQ temporarily goes high, two local bit lines LBL and bLBL are shorted as shown in FIG. 19 and charge sharing is performed between local bit lines LBL and bLBL (step ST22 of FIG. 16).

That is, the potentials of local bit lines LBL and bLBL are equalized to Vequ (=(Vwrite+Vss)/2) by capacitance coupling. For example, if Vss is ground potential (0 V), local bit lines LBL and bLBL float while at Vwrite/2.

Figure 20:
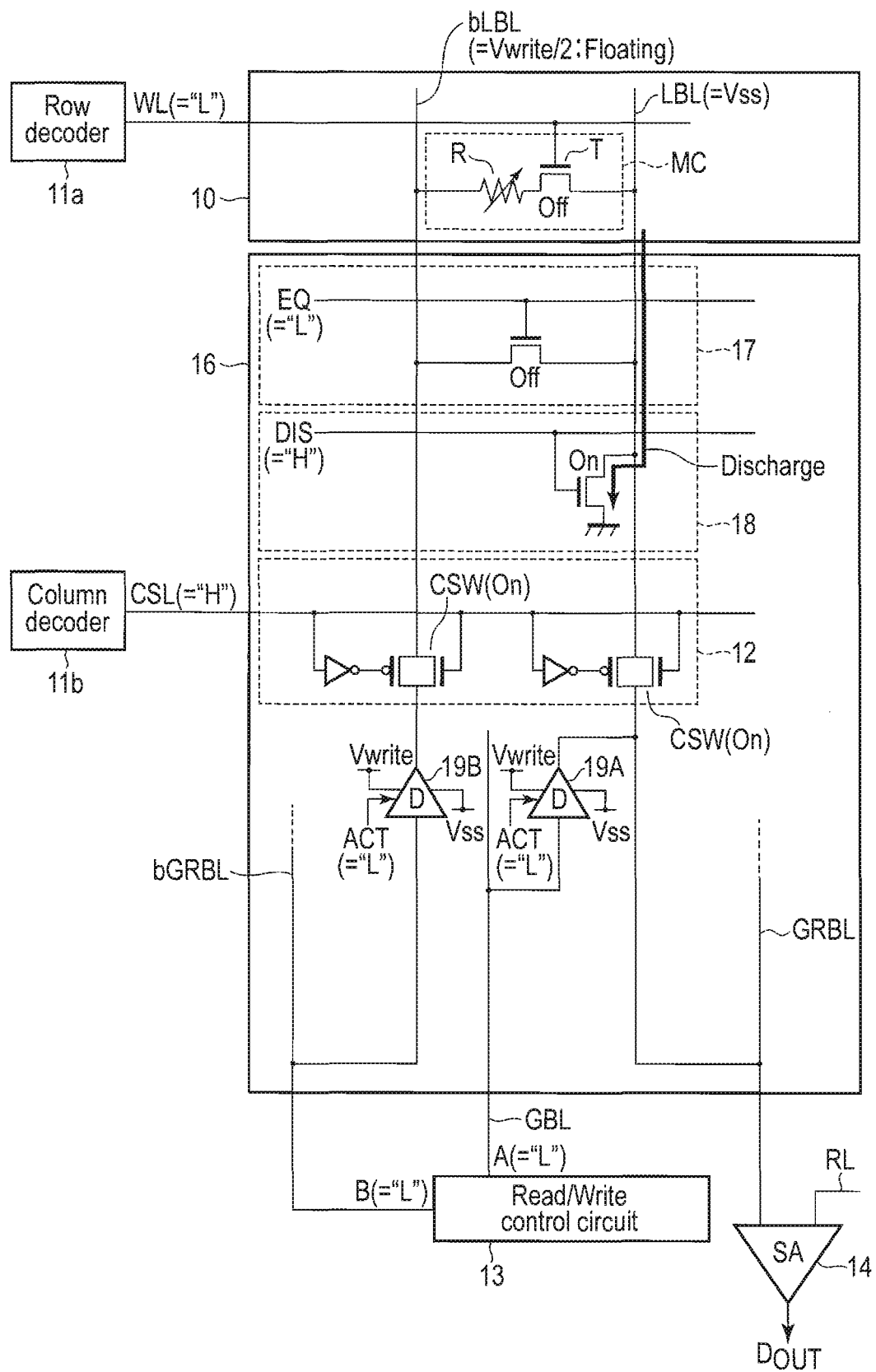
FIG. 20 is a circuit diagram showing an example of a step of discharging a bit line.

Next, from time Te to time Tf, a discharge signal DIS temporarily goes high and one of two local bit lines LBL and bLBL (in the present embodiment, local bit line LBL) is discharged to ground potential Vss as shown in FIG. 20 (step ST23 of FIG. 16).

As a result, for example, local bit line bLBL floats while at Vwrite/2 and local bit line LBL floats while at Vss. The operation of producing the read potential Vread (=Vequ) from the write potential Vwrite is thereby completed and preparations for passing the read current are finished.

In the same manner as the first embodiment, a time period from Ta to Tf during which the above setup is executed can be equal to or less than that in the case of producing the read potential Vread using a conventional read driver.

Next, evaluation is executed from time Tf to time Tg.

When a word line WL is made high at time Tf, a read current Imc flows from local bit line bLBL to local bit line LBL as shown in FIG. 21. As a result, the potential of a global read bit line GRBL can be evaluated by the sense amplifier 14 (steps ST24 and ST25 of FIG. 16).

Next, sensing and latching are executed from time Tg to time Ti.

Sensing and latching are executed by making a sense amplifier enable signal SAE high (steps ST26 and ST27 of FIG. 16).

That is, the sense amplifier 14 is enabled and outputs an output potential Dout according to data stored in the resistance-change element R in the memory cell MC based on the read current Imc flowing through the global read bit line GRBL and the reference current Irc flowing through the reference line RL.

After that, the read operation is completed at time Tj.

FIG. 22 shows a first example of the sense amplifier.

This sense amplifier 14 is a voltage-sensing type.

The sense amplifier 14 is enabled if control signal bSAE goes low. In this example, the sense amplifier 14 can evaluate a potential $V_{GRBL}$ of the global read bit line GRBL and a potential $V_{RL}$ of the reference line RL by an N-channel transistor in the sense amplifier 14 even before the sense amplifier 14 is enabled.

The step of evaluation in the above-described read operation corresponds to evaluation by the N-channel transistor in the sense amplifier 14 before the sense amplifier enable signal bSAE goes low.

If the sense amplifier 14 is enabled, a latch circuit formed by a P-channel transistor and the N-channel transistor in the sense amplifier 14 sense and latch data stored in the memory cell MC of FIG. 15. The sense amplifier 14 outputs the output potential $D_{OUT}$ according to the data stored in the memory cell MC of FIG. 15.

A precharge/equalizing circuit PEC resets the potential $V_{GRBL}$ of the global read bit line GRBL and the potential $V_{RL}$ of the reference line RL before the sense amplifier 14 executes sensing and latching. If control signal PE is high, the global read bit line GRBL and the reference line RL are set to, for example, ground potential Vss.

FIG. 23 shows a second example of the sense amplifier.

This sense amplifier 14 is a current-sensing type.

The sense amplifier 14 is enabled if control signal bSAE goes low.

If the sense amplifier 14 is enabled, a latch circuit formed by a P-channel transistor and an N-channel transistor in the sense amplifier 14 sense and latch data stored in the memory cell MC of FIG. 15. The sense amplifier 14 outputs the output potential $D_{OUT}$ according to the data stored in the memory cell MC of FIG. 15.

A precharge/equalizing circuit PEC resets nodes $N_{OUT}$ and $N_{OUT}'$ before the sense amplifier 14 executes sensing and latching. If control signal PE is high, nodes $N_{OUT}$ and $N_{OUT}'$ are set to, for example, ground potential Vss.

As described above, according to the nonvolatile semiconductor memory of the second embodiment, the size of the peripheral circuit of the memory cell and the power consumption can be reduced by producing both the write potential and the read potential by the same driver. In addition, since the read potential is produced from the write potential, it is not necessary to input the read potential from the outside of the chip or produce the read potential independently of the write potential.

Therefore, a large-capacity, energy-efficient nonvolatile semiconductor memory capable of reading data at high speed can be implemented.

Third Embodiment

The third embodiment relates to a method of producing the read potential Vread.

The read potential Vread is Vequ (=(Vwrite+Vss)/2) in the first and second embodiments, but the read potential Vread can be controlled more precisely by using charge, discharge and charge sharing of a pair of local bit lines LBL and bLBL in a non-selected column other than the pair of local bit lines LBK and bLBL in the selected column.

The read potential Vread can be controlled even more precisely by preliminarily mounting a new capacitance for adjusting the read potential Vread on the nonvolatile semiconductor memory (chip) and using charge, discharge and charge sharing of the new capacitance. It should be noted that the new capacitance means not a line capacitance but a capacitor having, for example, a metal-insulator-metal (MIM) structure.

Since the read potential Vread can be controlled precisely, a problem of variations in the read potential that occurs when producing the read potential from the write potential can be solved. That is, an optimum read current Vread can be produced even in case of variations in the write potential, a leak at the time of charge sharing and the like.

If a switched capacitor is used to produce the read potential Vread, stabilization of the read potential Vread can be further provided.

Figure 24:
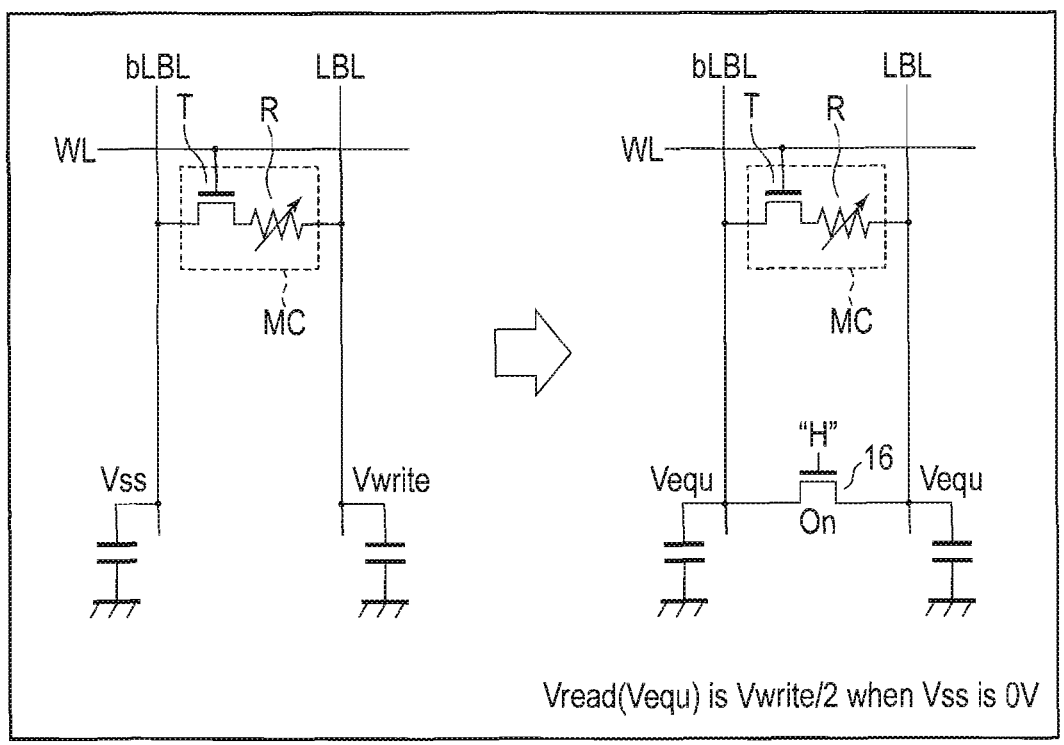

FIG. 24 shows a first example of the method of producing the read potential.

This example corresponds to the first and second embodiments.

Local bit line LBL is charged to Vwrite and local bit line bLBL is charged to Vss. Then, the equalizing circuit 16 is turned on and local bit lines LBL and bLBL are thereby changed to Vequ (=(Vwrite+Vss)/2).

After the equalizing circuit 16 is turned off, one of local bit lines LBL and bLBL is discharged to Vss and the other is at the read potential Vread (=Vequ).

In this example, the read potential Vread is Vwrite/2 when Vss is ground potential.

Figure 25:
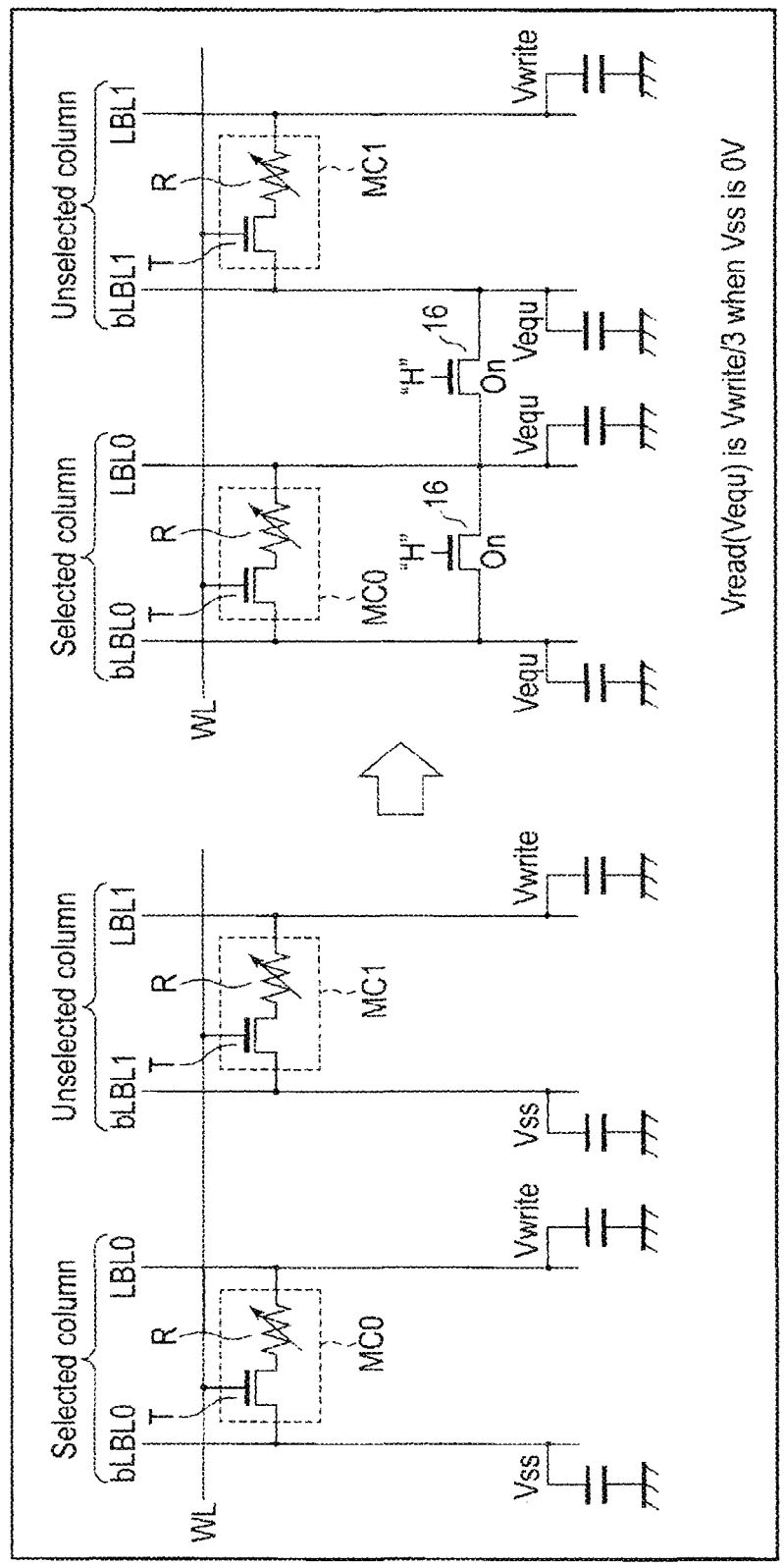

FIG. 25 shows a second example of the method of producing the read potential.

In this example, the read potential Vread is Vwrite/3 when Vss is ground potential.

Local bit lines LBL0 and LBL1 are charged to Vwrite and local bit lines bLBL0 and bLBL1 are charged to Vss. Then, the equalizing circuit 16 is turned on and three local bit lines LBL0, bLBL0 and bLBL1 are thereby changed to Vequ (=(Vwrite+2Vss)/3).

After the equalizing circuit 16 is turned off, one of local bit lines LBL0 and bLBL0 is discharged to Vss and the other is at the read potential Vread (=Vequ).

Figure 26:
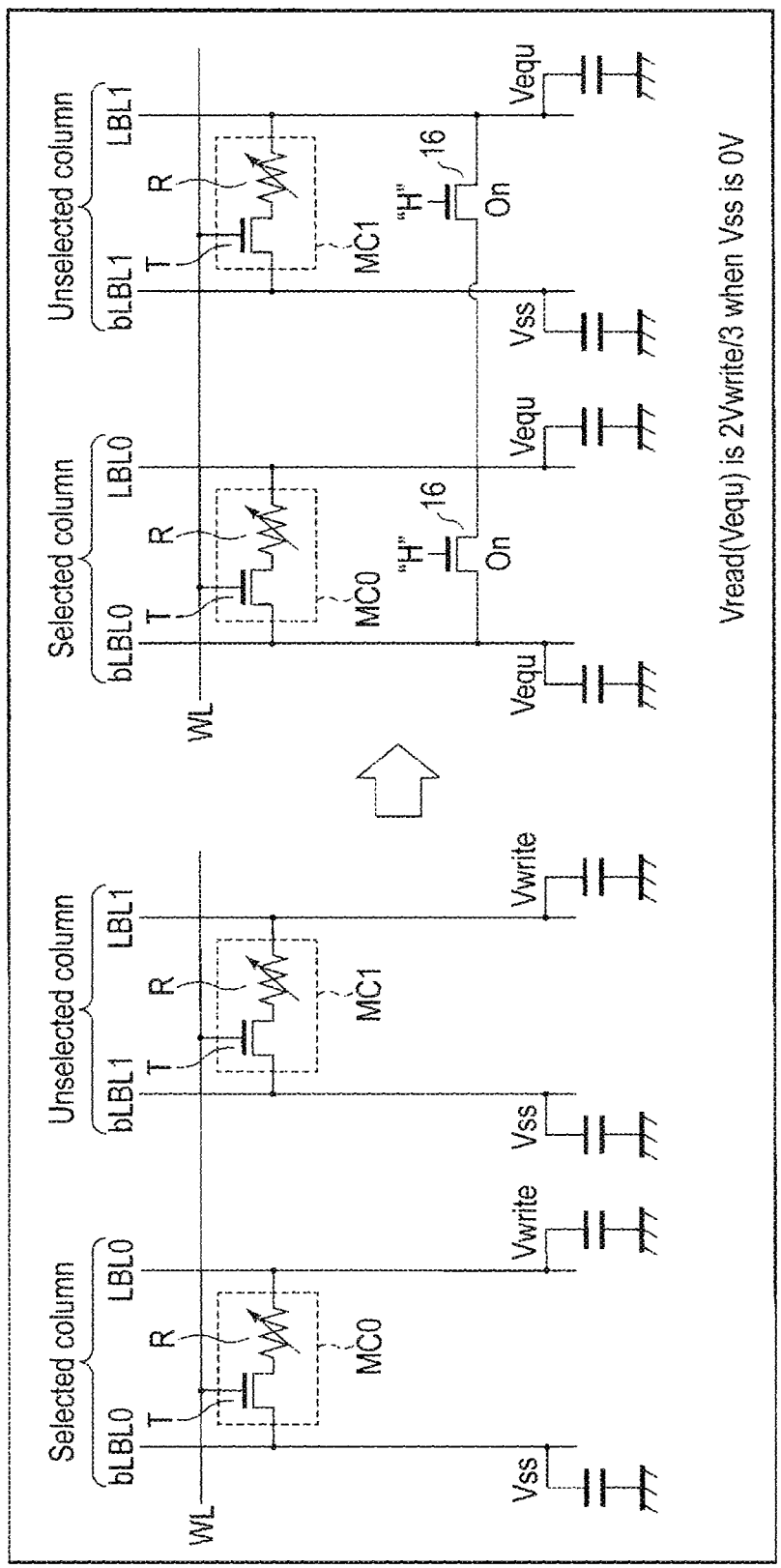

FIG. 26 shows a third example of the method of producing the read potential.

In this example, the read potential Vread is 2Vwrite/3 when Vss is ground potential.

Local bit lines LBL0 and LBL1 are charged to Vwrite and local bit lines bLBL0 and bLBL1 are charged to Vss. Then, the equalizing circuit 16 is turned on and three local bit lines LBL0, bLBL0 and LBL1 are thereby changed to Vequ (=(2Vwrite+Vss)/3).

After the equalizing circuit 16 is turned off, one of local bit lines LBL0 and bLBL0 is discharged to Vss and the other is at the read potential Vread (=Vequ).

Figure 27:
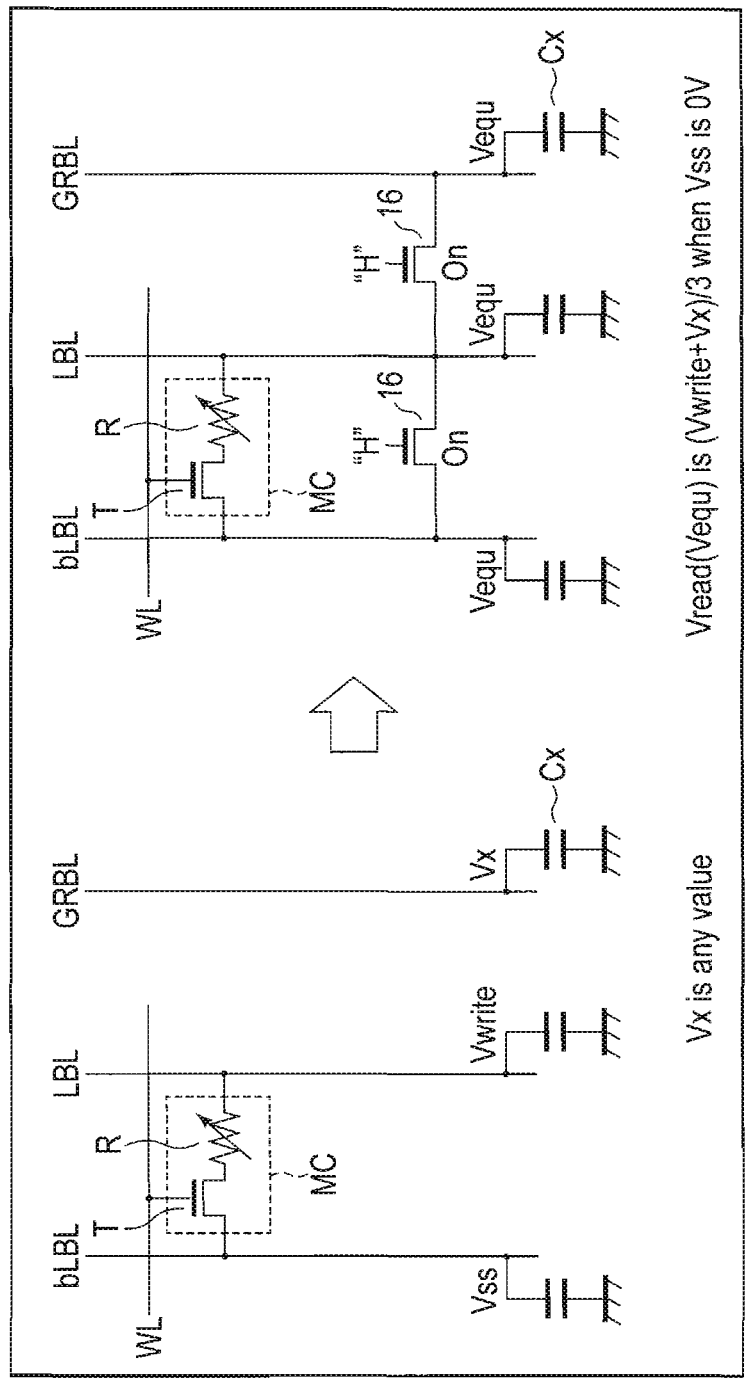

FIG. 27 shows a fourth example of the method of producing the read potential.

In this example, the read potential Vread can be fine-tuned by a new capacitance Cx (except line capacitance). The new capacitance Cx is connected to, for example, the global read bit line GRBL.

Local bit line LBL is charged to Vwrite and local bit line bLBL is charged to Vss. The new capacitance Cx is charged to Vx (Vx is an arbitrary value). Then, the equalizing circuit 16 is turned on and local bit lines LBL and bLBL and the new capacitance Cx are thereby changed to Vequ (=(Vwrite+Vss+Vx)/3).

After the equalizing circuit 16 is turned off, one of local bit lines LBL and bLBL is discharged to Vss and the other is at the read potential Vread (=Vequ).

In this example, the read potential Vread is (Vwrite+Vx)/3 when Vss is ground potential.

Figure 28:
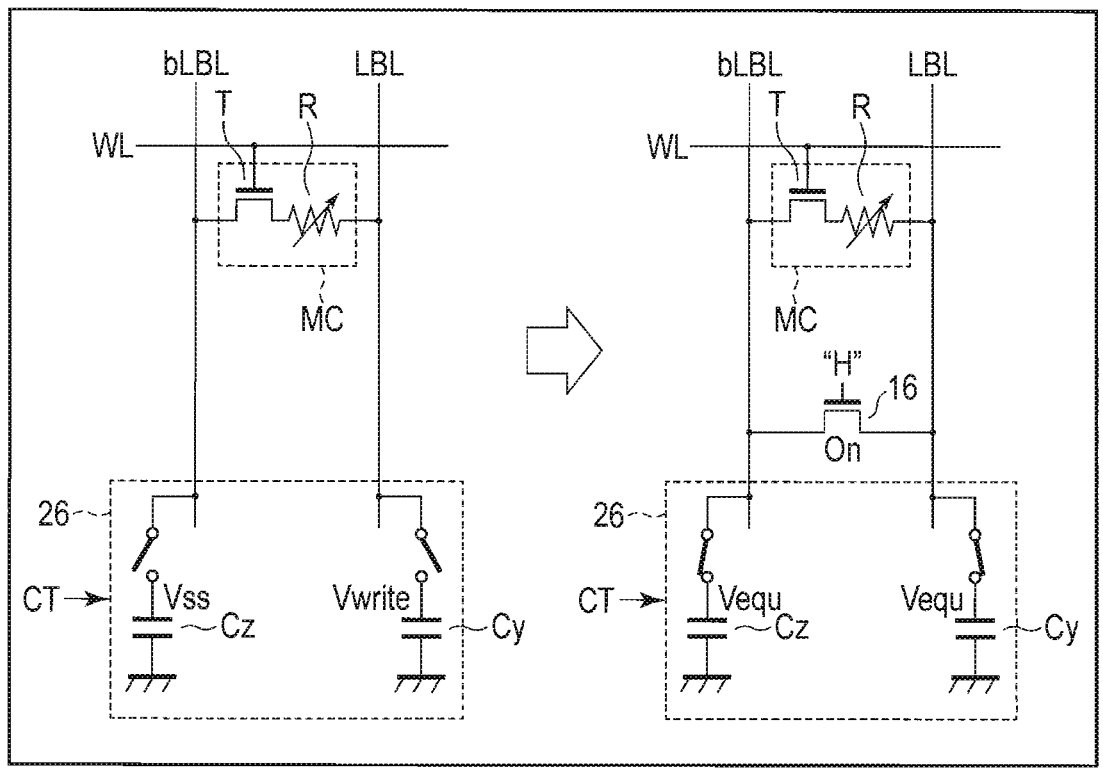

FIG. 28 shows a fifth example of the method of producing the read potential.

In this example, a switched capacitor 26 is used.

When a control signal CT is high, switches in the switched capacitor 26 are turned on. A capacitor Cy connected to local bit line LBL is charged to Vwrite and a capacitor Cz connected to local bit line bLBL is charged to Vss. Then, the equalizing circuit 16 is turned on and capacitors Cy and Cz are thereby changed to Vequ (=(Vwrite+Vss)/2) through local bit lines LBL and bLBL.

After the equalizing circuit 16 is turned off, one of local bit lines LBL and bLBL is discharged to Vss and the other is at the read potential Vread (=Vequ).

In this example, the read potential Vread is Vwrite/2 when Vss is ground potential.

It should be noted that control signal CT is temporarily made low after producing Vread and before passing the read current. The switches in the switched capacitor 26 are thereby turned off to maintain the stable read potential Vread.

FIG. 29 shows a sixth example of the method of producing the read potential.

This example is a modified example of the fifth example (FIG. 28).

The switched capacitor 26 comprises capacitors Cy0, Cy1, ..., Cyn connected to local bit line LBL and capacitors Cz0, Cz1, ..., Czn connected to local bit line bLBL.

For example, capacitors Cy0, Cy1, ..., Cyn are charged to Vread and local bit line bLBL is charged to Vss. Then, switches in the switched capacitor 26 are sequentially turned on. The read operation can thereby be executed continuously for memory cells MC0, MC1, ..., MCn.

Fourth Embodiment

FIG. 30 shows an example of the read operation.

This example relates to a 2 cell/1 bit type nonvolatile semiconductor memory which stores one bit in two memory cells.

The nonvolatile semiconductor memory corresponds to the first and second embodiments, and the sense amplifier 14 is the voltage-sensing type sense amplifier of FIG. 13. The read potential Vread (Vequ) is produced in the same manner as the first, second and third embodiments.

Memory cells MC and MC' store complementary data. For example, the memory cell MC stores binary 1 and the memory cell MC' stores binary 0.

A read current Imc flows from local bit line LBL to local bit line bLBL. A read current Imc' flows from local bit line LBL' to local bit line bLBL'.

The sense amplifier 14 outputs output data $D_{OUT}$ by comparing a potential $V_{GRBL}$ of the global read bit line GRBL with a potential $V_{GRBL}'$ of the global read bit line GRBL'.

Figure 31:
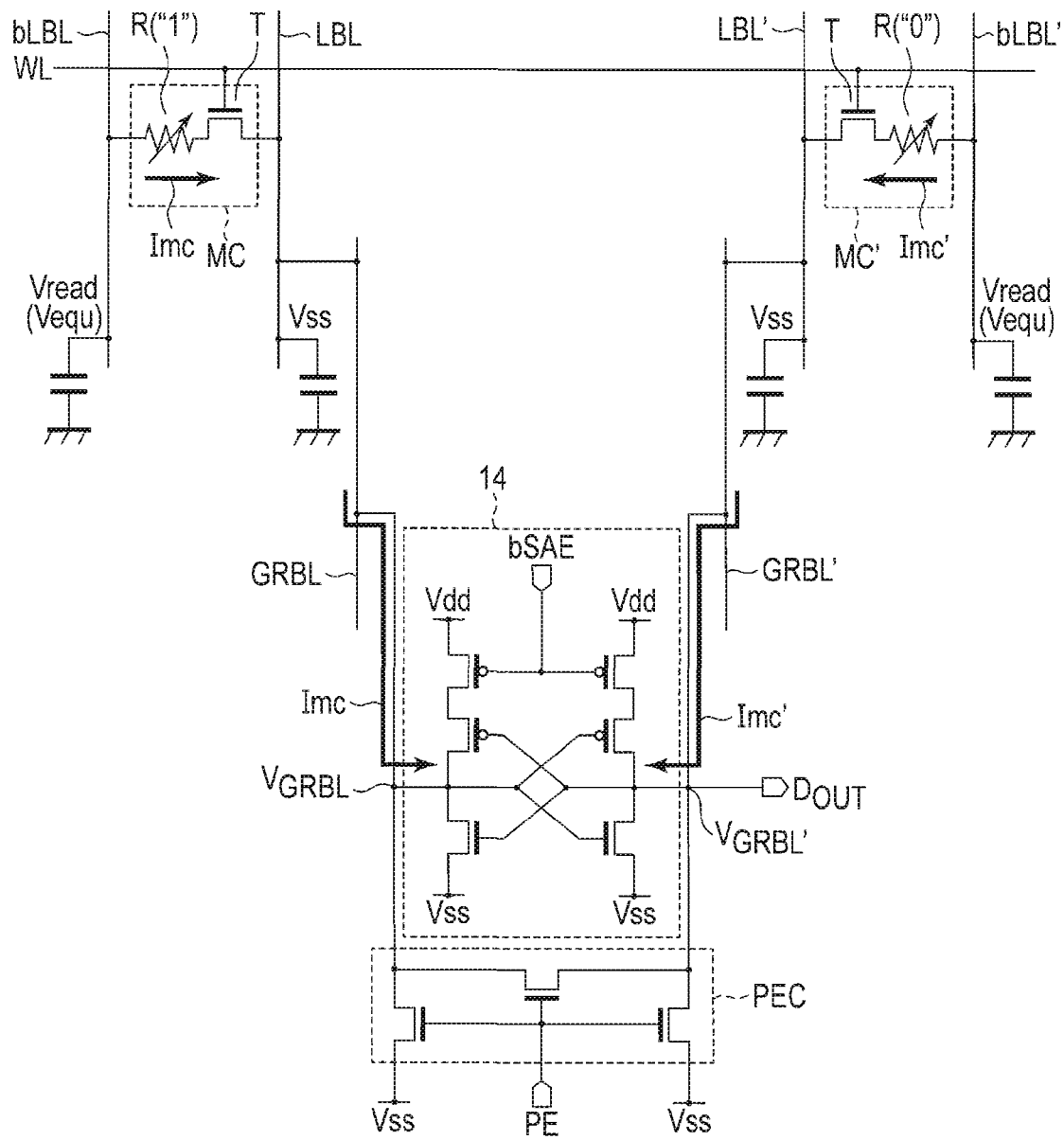

FIG. 31 shows an example of the read operation.

This example also relates to a 2 cell/1 bit type nonvolatile semiconductor memory which stores one bit in two memory cells.

The nonvolatile semiconductor memory corresponds to the first and second embodiments, and the sense amplifier 14 is the voltage-sensing type sense amplifier of FIG. 22. The read potential Vread (Vequ) is produced in the same manner as the first, second and third embodiments.

Memory cells MC and MC' store complementary data. For example, the memory cell MC stores binary 1 and the memory cell MC' stores binary 0.

A read current Imc flows from local bit line bLBL to local bit line LBL. A read current Imc' flows from local bit line bLBL' to local bit line LBL'.

The sense amplifier 14 outputs output data $D_{OUT}$ by comparing a potential $V_{GRBL}$ of the global read bit line GRBL with a potential $V_{GRBL}'$ of the global read bit line GRBL'.

(Example of Application)

In a processor used for a portable information terminal, the power consumption needs to be reduced. One of methods for reducing the power consumption in the processor is replacing a static random access memory (SRAM)-based cache memory having large standby power consumption with a nonvolatile semiconductor memory using a nonvolatile element.

In the SRAM, leakage current tends to increase both during operation and standby (non-operation) with miniaturization of transistors. If a cache memory is replaced with a nonvolatile semiconductor memory, the power can be shut down and the energy consumption reduced during standby.

Therefore, there is no doubt that use of the nonvolatile semiconductor memory of the embodiments as a cache memory contributes to the implementation of an energy-efficient processor.

The following is a description of an example of an energy-efficient processor system to which the nonvolatile semiconductor memory of the embodiments is applicable.

Figure 32:
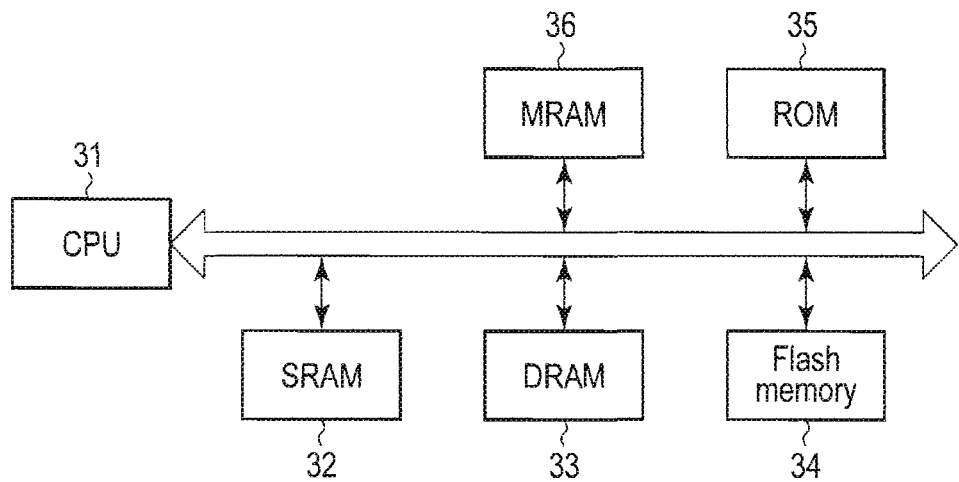
FIG. 32 is a diagram showing an example of a nonvolatile cache system.

FIG. 32 shows the example of the energy-efficient processor system.

A CPU 31 controls an SRAM 32, a DRAM 33, a flash memory 34, a ROM 35 and a magnetic random access memory (MRAM) 36. The MRAM 36 corresponds to the nonvolatile semiconductor memory of the embodiments.

The MRAM 36 can be used as a substitute for any of the SRAM 32, the DRAM 33, the flash memory 34 and the ROM 35. Accordingly, at least one of the SRAM 32, the DRAM 33, the flash memory 34 and the ROM 35 may be omitted.

The MRAM 36 can be used as a nonvolatile cache memory (for example, an L2 cache).

Figure 33:
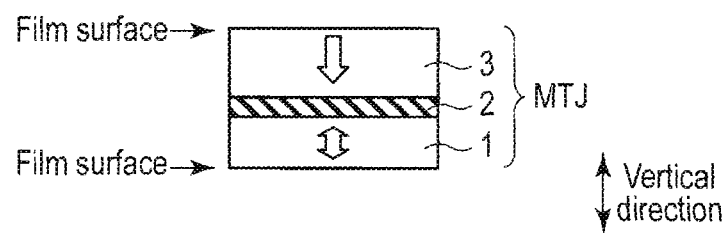
FIG. 33 and FIG. 34 are illustrations each showing an example of a magnetoresistive element.

FIG. 33 shows a basic structure of a magnetoresistive element.

A magnetoresistive element MTJ is used as a memory cell of the MRAM. The magnetoresistive element MTJ has a stacked layer structure in which a storage layer (ferromagnetic layer) 1 with perpendicular and variable magnetization, a tunnel barrier layer (nonmagnetic layer) 2 and a reference layer (ferromagnetic layer) 3 with perpendicular and invariable magnetization are stacked sequentially in the direction perpendicular to the film surface (perpendicular direction).

The invariable magnetization means that the direction of magnetization does not vary before and after a write operation, whereas the variable magnetization means that the direction of magnetization can vary in the opposite direction before and after a write operation.

The write operation means spin-transfer write in which spin torque is applied to magnetization of the storage layer 1 by passing a spin-transfer current (spin-polarized electrons) through the magnetoresistive element MTJ.

For example, when passing the spin-transfer current from the storage layer 1 to the reference layer 3, the electrons that are spin-polarized in the same direction as the magnetization of the reference layer 3 are injected into the storage layer 1, and spin torque is applied to the magnetization of the storage layer 1, with the result that the direction of magnetization of the storage layer 1 becomes equal to that of the reference layer 3 (parallel state).

When passing the spin-transfer current from the reference layer 3 to the storage layer 1, the electrons that are spin-polarized in the direction opposite to the magnetization of the reference layer 3, which are included in the electrons from the storage layer 1 to the reference layer 3, are returned into the storage layer 1, and spin torque is applied to the magnetization of the storage layer 1, with the result that the direction of magnetization of the storage layer 1 becomes opposite to that of the reference layer 3 (antiparallel state).

Because of the magnetoresistive effect, the resistance of the magnetoresistive element MTJ varies with the relative directions of magnetization of the reference layer 3 and the storage layer 1. More specifically, the resistance of the magnetoresistive element MTJ becomes small in the parallel state and large in the antiparallel state. On the assumption that the resistance in the parallel state is R0 and the resistance in the antiparallel state is R1, a value defined by (R1−R0)/R0 is called a magnetoresistive ratio.

The magnetization of the reference layer 3 is fixed toward the storage layer 1 in this example, but may be fixed opposite to the storage layer 1. When the magnetoresistive element MTJ is formed on a semiconductor substrate, the reference layer 3 can be arranged above the storage layer 1, and vice versa.

For example, when the reference layer 3 is arranged above the storage layer 1, the magnetoresistive element MTJ is called a top-pin type, and when the reference layer 3 is arranged under the storage layer 1, the magnetoresistive effect element MTJ is called a bottom-pin type.

Figure 34:
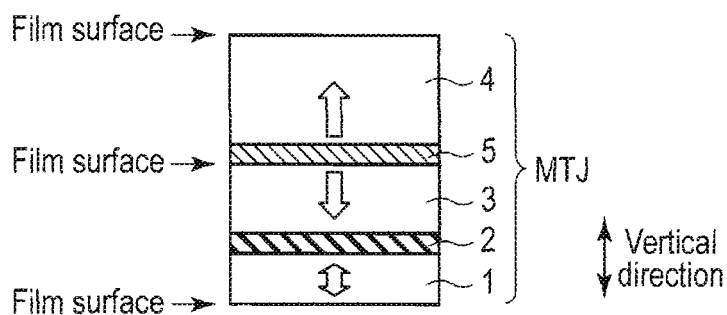

FIG. 34 shows an example of a magnetoresistive element comprising a shift canceling layer.

A magnetoresistive element MTJ has a stacked layer structure in which a storage layer (ferromagnetic layer) 1 with perpendicular and variable magnetization, a tunnel barrier layer (nonmagnetic layer) 2 and a reference layer (ferromagnetic layer) 3 with perpendicular and invariable magnetization are stacked sequentially in the perpendicular direction.

The magnetoresistive element MTJ further comprises a shift canceling layer (ferromagnetic layer) 4 with perpendicular and invariable magnetization on the reference layer 3 side. A nonmagnetic layer (for example, a metal layer) 5 is arranged between the reference layer 3 and the shift canceling layer 4.

In this example, the reference layer 3 and the storage layer 1 have perpendicular magnetization. In this case, a stray magnetic field from the reference layer 3 is directed toward the direction of magnetization (perpendicular direction) of the storage layer 1 and thus a stray magnetic field having a large perpendicular component is applied to the storage layer 1. This stray magnetic field acts in a direction in which the direction of magnetization of the storage layer 1 is made equal to that of the reference layer 3 (parallel state).

Accordingly, a shift of magnetization reversal characteristic (hysteresis curve) of the storage layer 1 occurs.

That is, a small spin-transfer current has only to flow into the magnetoresistive element MTJ in order to change the magnetoresistive element MTJ from the antiparallel state to the parallel state, but a large spin-transfer current has to flow into the magnetoresistive element MTJ in order to change the magnetoresistive element MTJ from the parallel state to the antiparallel state.

Further, the antiparallel state becomes unstable because of the stray magnetic field from the reference layer 3.

More specifically, if the stray magnetic field is larger than the coercive force of the storage layer 1, the storage layer 1 cannot maintain the antiparallel state. Even if the stray magnetic field is smaller than the coercive force of the storage layer 1, there is a possibility that the magnetization of the storage layer 1 is inverted from the antiparallel state to the parallel state by the stray magnetic field considering a fluctuation in magnetization due to thermal agitation.

To resolve the problem, the shift canceling layer 4 is provided.

In this example, the reference layer 3 and the shift canceling layer 4 are stacked one on the other. In this case, the direction of magnetization of the shift canceling layer 4 is set to a direction opposite to that of the reference layer 3. In the storage layer 1, therefore, the stray magnetic field from the reference layer 3 is canceled by a canceling magnetic field from the shift canceling layer 4, with the result that a shift in the RH curve of the storage layer 1 can be canceled.

CONCLUSION

As described above, according to the embodiments, the size of the peripheral circuit of the memory cell and the power consumption can be reduced by producing both the write potential and the read potential by the same driver.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a resistance-change element having first and second terminals;
a transistor having third and fourth terminals and a control terminal, the third terminal being electrically connected to the second terminal;
a driver electrically connected to the first and fourth terminals, applying one of a first potential and a second potential to the first terminal and the other of the first and second potentials to the fourth terminal in writing, and applying one of the first and second potentials to the first terminal and the other of the first and second potentials to the fourth terminal in reading; and
a circuit electrically connected between the first and fourth terminals, and changing potentials of the first and fourth terminals to a third potential between the first and second potentials in the reading.

2. The memory of claim 1, further comprising:
a circuit discharging one of the first and fourth terminals which have the third potential in the reading.

3. The memory of claim 2, further comprising:
a decoder applying a fourth potential for turning on the transistor to the control terminal in a state in which one of the first and fourth terminals is discharged and the other of the first and fourth terminals holds the third potential in the reading.

4. The memory of claim 3, further comprising:
a sense amplifier electrically connected to one of the first and fourth terminals and sensing data stored in the resistance-change element.

5. The memory of claim 1, wherein
the first potential is larger than the second potential.

6. The memory of claim 1, wherein
the second potential is larger than the first potential.

7. The memory of claim 1, wherein
one of the first and second potentials is a write potential, and the third potential is a read potential.

8. The memory of claim 1, wherein
the driver is a write driver.

9. The memory of claim 1, wherein
the resistance-change element is a magnetoresistive element.

10. The memory of claim 1, wherein
the circuit changes potentials of the first and fourth terminals to the third potential before sensing.

11. A nonvolatile semiconductor memory comprising:
a resistance-change element having first and second terminals;
a transistor having third and fourth terminals and a control terminal, the third terminal being electrically connected to the second terminal;
a driver electrically connected to the first and fourth terminals, applying one of a first potential and a second potential to the first terminal and the other of the first and second potentials to the fourth terminal in writing, and applying one of the first and second potentials to the first terminal and the other of the first and second potentials to the fourth terminal in reading; and
a node set to be a fourth potential,
wherein the circuit produces the third potential by shorting the first terminal, the fourth terminal and the node in the reading.

12. The memory of claim 11, wherein
the first and fourth terminals are connected to first and second bit lines, respectively, and the node is connected to a third bit line.

13. The memory of claim 11, wherein
the first and fourth terminals are connected to first and second bit lines, respectively, and the node is connected to a global bit line connected to one of the first and second bit lines.

14. The memory of claim 13, wherein
the fourth potential is held in a capacitance connected to the global bit line.

15. The memory of claim 11, wherein
the fourth potential is substantially equal to the first potential.

16. The memory of claim 11, wherein
the fourth potential is substantially equal to the second potential.

17. The memory of claim 11, wherein
the fourth potential is different from the first and second potentials.

18. A nonvolatile semiconductor memory comprising:
a resistance-change element having first and second terminals;
a transistor having third and fourth terminals and a control terminal, the third terminal being electrically connected to the second terminal;
a driver electrically connected to the first and fourth terminals, applying one of a first potential and a second potential to the first terminal and the other of the first and second potentials to the fourth terminal in writing, and applying one of the first and second potentials to the first terminal and the other of the first and second potentials to the fourth terminal in reading;
a first capacitance electrically connected to the first terminal and holding one of the first and second potentials in the reading; and
a second capacitance electrically connected to the fourth terminal and holding the other of the first and second potentials in the reading.

19. A nonvolatile semiconductor memory comprising:
a resistance-change element having first and second terminals;
a transistor having third and fourth terminals and a control terminal, the third terminal being electrically connected to the second terminal;
a driver electrically connected to the first and fourth terminals, applying one of a first potential and a second potential to the first terminal and the other of the first and second potentials to the fourth terminal in writing, and applying one of the first and second potentials to the first terminal and the other of the first and second potentials to the fourth terminal in reading;
first and second capacitances electrically connected to the first terminal and holding one of the first and second potentials in the reading; and
third and fourth capacitances electrically connected to the fourth terminal and holding the other of the first and second potentials in the reading.

20. The memory of claim 19, further comprising:
first and second memory cells each including the resistance-change element and the transistor,
wherein data stored in the first memory cell is read by using the first and second potentials held in the first and third capacitances, and data stored in the second memory cell is read by using the first and second potentials held in the second and fourth capacitances.

* * * * *